(12) United States Patent
Baringer et al.

(10) Patent No.: US 9,294,328 B2
(45) Date of Patent: Mar. 22, 2016

(54) IN-PHASE AND QUADRATURE RADIO FREQUENCY DIGITAL-TO-ANALOG CONVERTER

(71) Applicant: The Boeing Company, Chicago, IL (US)

(72) Inventors: Cynthia D. Baringer, Piedmont, CA (US); Donald A. Hitko, Grover Beach, CA (US)

(73) Assignee: The Boeing Company, Chicago, IL (US)

(*) Notice: Subject to any disclaimer, the term of this patent is extended or adjusted under 35 U.S.C. 154(b) by 0 days.

(21) Appl. No.: 14/878,856

(22) Filed: Oct. 8, 2015

(65) Prior Publication Data

US 2016/0028579 A1    Jan. 28, 2016

Related U.S. Application Data

(63) Continuation of application No. 14/316,112, filed on Jun. 26, 2014, now Pat. No. 9,184,974.

(51) Int. Cl.
*H04L 27/36* (2006.01)
*H04L 27/26* (2006.01)

(52) U.S. Cl.
CPC .......... *H04L 27/362* (2013.01); *H04L 27/2637* (2013.01)

(58) Field of Classification Search
CPC .......................... H04L 27/362; H04L 27/2637
See application file for complete search history.

(56) References Cited

U.S. PATENT DOCUMENTS

| | | | |
|---|---|---|---|
| 6,463,295 B1 | 10/2002 | Yun | |
| 6,952,177 B1 | 10/2005 | Hitko | |
| 8,184,031 B1 | 5/2012 | Mrozek et al. | |
| 8,401,600 B1 | 3/2013 | Filippov et al. | |
| 8,532,236 B2 | 9/2013 | Kerth | |
| 8,660,214 B1 | 2/2014 | Huynh | |
| 8,995,600 B1* | 3/2015 | Gopalakrishnan | H04L 7/0331 375/376 |
| 2004/0077327 A1* | 4/2004 | Lim | H03B 5/366 455/318 |
| 2004/0166815 A1* | 8/2004 | Maligeorgos | H03L 7/085 455/73 |
| 2005/0003762 A1 | 1/2005 | Kerth et al. | |
| 2005/0152265 A1* | 7/2005 | Denk | H04B 1/707 370/209 |
| 2006/0269014 A1* | 11/2006 | Li | H03B 27/00 375/327 |

(Continued)

OTHER PUBLICATIONS

Alavi, et al., "A 2-GHz Digital I/Q Modulator in 65-nm CMOS", IEEE Asian Solid-State Circuits Conference, Nov. 2011, Jeju, South Korea.

(Continued)

*Primary Examiner* — Erin File
(74) *Attorney, Agent, or Firm* — Kunzler Law Group, PC

(57) ABSTRACT

Disclosed herein is an apparatus for radio frequency digital-to-analog conversion of in-phase and quadrature bit streams. The apparatus may include a plurality of in-phase multiplying cells that receive an in-phase local oscillator signal and a plurality of in-phase bits, a plurality of quadrature multiplying cells that receive a quadrature local oscillator signal and a plurality of quadrature bits, a first output line connected to a first set of the plurality of in-phase multiplying cells and a first set of the plurality of quadrature multiplying cells, and a second output line connected to a second set of the plurality of in-phase multiplying cells and a second set of the plurality of quadrature multiplying cells. Each multiplying cell produces an output signal based on a received input bit. The output signals from each multiplying cell combine in phase on the connected output line.

20 Claims, 8 Drawing Sheets

(56) References Cited

U.S. PATENT DOCUMENTS

| | | | |
|---|---|---|---|
| 2008/0311860 A1* | 12/2008 | Tanaka | H04B 1/28 455/73 |
| 2009/0323862 A1 | 12/2009 | Heo | |
| 2010/0056095 A1 | 3/2010 | Wu | |
| 2011/0025415 A1 | 2/2011 | Mu | |
| 2011/0211649 A1* | 9/2011 | Hahn | H04B 1/525 375/285 |
| 2012/0008705 A1 | 1/2012 | Lee et al. | |
| 2012/0128092 A1 | 5/2012 | Lai et al. | |

OTHER PUBLICATIONS

Balteanu. et al., "A 6-bit Segmented RZ DAC Architecture with up to 50-GHz Sampling Clock and 4 Vpp Differential Swing", Microwave Symposium Digest (MTT), 2012 IEEE MTT-S International, pp. 1-3.

Office Action for U.S. Appl. No. 14/316,112 dated Mar. 23, 2015.

European Search Report for European Application No. 15171597.6 dated Dec. 18, 2015.

Hasting, "An Introduction to Matching and Layout", Texas Instruments, pp. 1-21.

* cited by examiner

| | Q[2] | Q[1] | Q[0] | I[2] | I[1] | I[0] |
|---|---|---|---|---|---|---|
| Out$_1$ | $\pm(1+3\delta)LO_Q$<br>$\pm(1-3\delta)LO_Q$ | $\pm(1+\delta)LO_Q$<br>$\pm(1-\delta)LO_Q$ | - | $\pm(1+2\delta)LO_I$<br>$\pm(1-2\delta)LO_I$ | - | $\pm LO_I$ |
| Out$_2$ | $\pm(1+2\delta)LO_Q$<br>$\pm(1-2\delta)LO_Q$ | - | $\pm LO_Q$ | $\pm(1+3\delta)LO_I$<br>$\pm(1-3\delta)LO_I$ | $\pm(1+\delta)LO_I$<br>$\pm(1-\delta)LO_I$ | - |
| Out | $\pm 4LO_Q$ | $\pm 2LO_Q$ | $\pm LO_Q$ | $\pm 4LO_I$ | $\pm 2LO_I$ | $\pm LO_I$ |

| | Q[3] | Q[2] | Q[1] | Q[0] | I[3] | I[2] | I[1] | I[0] |
|---|---|---|---|---|---|---|---|---|
| Out$_1$ | $\pm(1+7\delta)LO_Q$<br>$\pm(1+3\delta)LO_Q$<br>$\pm(1-3\delta)LO_Q$<br>$\pm(1-7\delta)LO_Q$ | $\pm(1+5\delta)LO_Q$<br>$\pm(1-5\delta)LO_Q$ | $\pm(1+\delta)LO_Q$<br>$\pm(1-\delta)LO_Q$ | - | $\pm(1+6\delta)LO_I$<br>$\pm(1-2\delta)LO_I$<br>$\pm(1-2\delta)LO_I$<br>$\pm(1-6\delta)LO_I$ | $\pm(1+4\delta)LO_I$<br>$\pm(1-4\delta)LO_I$ | - | $\pm LO_I$ |
| Out$_2$ | $\pm(1+6\delta)LO_Q$<br>$\pm(1+2\delta)LO_Q$<br>$\pm(1-2\delta)LO_Q$<br>$\pm(1-6\delta)LO_Q$ | $\pm(1+4\delta)LO_Q$<br>$\pm(1-4\delta)LO_Q$ | - | $\pm LO_Q$ | $\pm(1+7\delta)LO_I$<br>$\pm(1+3\delta)LO_I$<br>$\pm(1-3\delta)LO_I$<br>$\pm(1-7\delta)LO_I$ | $\pm(1+5\delta)LO_I$<br>$\pm(1-5\delta)LO_I$ | $\pm(1+\delta)LO_I$<br>$\pm(1-\delta)LO_I$ | - |
| Out | $\pm 8LO_Q$ | $\pm 4LO_Q$ | $\pm 2LO_Q$ | $\pm LO_Q$ | $\pm 8LO_I$ | $\pm 4LO_I$ | $\pm 2LO_I$ | $\pm LO_I$ |

| | Q[3] | Q[2] | Q[1] | Q[0] | I[3] | I[2] | I[1] | I[0] |
|---|---|---|---|---|---|---|---|---|
| Out$_1$ | $\pm(1+7\delta)LO_Q$<br>$\pm(1+5\delta)LO_Q$<br>$\pm(1-5\delta)LO_Q$<br>$\pm(1-7\delta)LO_Q$ | $\pm(1+3\delta)LO_Q$<br>$\pm(1-3\delta)LO_Q$ | $\pm(1+\delta)LO_Q$<br>$\pm(1-\delta)LO_Q$ | - | $\pm(1+6\delta)LO_I$<br>$\pm(1+4\delta)LO_I$<br>$\pm(1-4\delta)LO_I$<br>$\pm(1-6\delta)LO_I$ | $\pm(1+2\delta)LO_I$<br>$\pm(1-2\delta)LO_I$ | - | $\pm LO_I$ |
| Out$_2$ | $\pm(1+6\delta)LO_Q$<br>$\pm(1+4\delta)LO_Q$<br>$\pm(1-4\delta)LO_Q$<br>$\pm(1-6\delta)LO_Q$ | $\pm(1+2\delta)LO_Q$<br>$\pm(1-2\delta)LO_Q$ | - | $\pm LO_Q$ | $\pm(1+7\delta)LO_I$<br>$\pm(1+5\delta)LO_I$<br>$\pm(1-5\delta)LO_I$<br>$\pm(1-7\delta)LO_I$ | $\pm(1+3\delta)LO_I$<br>$\pm(1-3\delta)LO_I$ | $\pm(1+\delta)LO_I$<br>$\pm(1-\delta)LO_I$ | - |
| Out | $\pm 8LO_Q$ | $\pm 4LO_Q$ | $\pm 2LO_Q$ | $\pm LO_Q$ | $\pm 8LO_I$ | $\pm 4LO_I$ | $\pm 2LO_I$ | $\pm LO_I$ |

IN-PHASE AND QUADRATURE RADIO FREQUENCY DIGITAL-TO-ANALOG CONVERTER

CROSS-REFERENCE TO RELATED APPLICATION

This is a continuation application of U.S. patent application Ser. No. 14/316,112, filed Jun. 26, 2014, which is incorporated herein by reference.

FIELD

The present disclosure relates generally to high bandwidth digital-to-analog (D/A) converters, and relates more particularly to an in-phase and quadrature radio frequency (RF) D/A converter that uses a traveling wave multiplying D/A converter to synthesize high resolution RF signals at microwave and millimeter wave frequencies.

BACKGROUND

Complex signal synthesis involves combining an in-phase signal with a quadrature signal. The in-phase signal and the quadrature signal are modulated onto RF carrier signals having a ninety degree (90°) phase difference. Complex signals are widely used in modern communication systems because of their increased spectral efficiency over real component signals.

A digital-to-analog (D/A) converter takes a digital input and produces an analog output. D/A converters are especially useful in modern communication systems as microprocessors and other computers operate in the digital domain, but often need to communicate using analog signals. However, conventional D/A converters are limited in output frequency and bandwidth. Conventional D/A converters for complex signals are more than twice the size (and complexity) of D/A converters for non-complex signals.

Additionally, conventional D/A converters for complex signals suffer from false signals generated by the D/A converter process. These unwanted signals are known as image signals or aliased signals. For example, the D/A converter may generate image signals about the RF carrier during the up-conversion process, one signal being desired while the other signal being undesirable. Image frequency errors due to the aliased signals waste power on the unwanted image signal, thereby degrading signal strength of the desired signal and causing interference with other signals at the frequency of the unwanted, alias signal. RF filters can remove the unwanted image signals, but they are large and expensive, particularly for image signals having frequencies near the desired signal.

SUMMARY

The subject matter of the present application has been developed in response to the present state of the art, and in particular, in response to the shortcomings of conventional D/A converters that have not yet been fully solved by currently available techniques. Accordingly, the subject matter of the present application has been developed to provide an apparatus for radio frequency D/A conversion of in-phase and quadrature bit streams that overcomes at least some of the above-discussed shortcomings of prior art techniques. The subject matter of the present application also includes a system and method that may perform the functions of the apparatus.

The apparatus for radio frequency D/A conversion of in-phase and quadrature bit streams may include a plurality of in-phase multiplying cells that receive an in-phase local oscillator signal and a plurality of in-phase bits, each in-phase multiplying cell producing an output signal based on a received one of the plurality of in-phase bits, a plurality of quadrature multiplying cells that receive a quadrature local oscillator signal and a plurality of quadrature bits, each quadrature multiplying cell producing an output signal based on the received one of the plurality of quadrature bits, a first output line connected to a first set of the plurality of in-phase multiplying cells and a first set of the plurality of quadrature multiplying cells, the first output line propagating a first output signal produced from output signals of the first set of in-phase multiplying cells and the first set of quadrature multiplying cells, and a second output line connected to a second set of the plurality of in-phase multiplying cells and a second set of the plurality of quadrature multiplying cells, the second output line propagating a second output signal produced from output signals of the second set of in-phase multiplying cells and the second set of quadrature multiplying cells. The output signals from each multiplying cell combine in phase on a connected output line.

The apparatus may include a plurality of input bit lines, each bit line corresponding to a one of the plurality of input bits. In some embodiments, the multiplying cells are component-matched multiplying cells and have substantially identical impedances and propagation delays. In some embodiments, the in-phase multiplying cells are interleaved among the quadrature multiplying cells, the number of in-phase multiplying cells being equal to the number of quadrature multiplying cells.

In some embodiments, the multiplying cells may be arranged in an array of multiplying cells having first and second rows, the first row including the first sets of in-phase and quadrature multiplying cells and the second row including the second set of in-phase and quadrature multiplying cells. The in-phase multiplying cells may be interleaved among the quadrature multiplying cells on the first and second rows. In some embodiments, each column in the array of multiplying cells consists of one of the in-phase multiplying cells and one of the quadrature multiplying cells. The apparatus may include a binary-weighted number of multiplying cells are connected to each input bit according to the significance of the input bit.

In some embodiments, an in-phase multiplying cell connected to the least significant in-phase bit is arranged at a center of the first row and a quadrature multiplying cell connected to the least significant quadrature bit is arranged at a center of the second row. Pairs of multiplying cells connected to other bits may be symmetrically arranged with respect to the center cells.

The system for radio frequency D/A conversion of in-phase and quadrature bit streams may include a local oscillator module that provides an in-phase local oscillator signal and a quadrature local oscillator signal; a digital data module that provides a plurality of in-phase bits and a plurality of quadrature bits; an in-phase/quadrature (I/Q) D/A converter comprising a plurality of in-phase multiplying cells that receive the in-phase local oscillator signal and the plurality of in-phase bits, each in-phase multiplying cell modulating a received one of the plurality of in-phase bits onto the in-phase local oscillator signal, a plurality of quadrature multiplying cells that receive the quadrature local oscillator signal and the plurality of quadrature bits, each quadrature multiplying cell modulating a received one of the plurality of quadrature bits onto the quadrature local oscillator signal, a first output line connected to a first set of the plurality of in-phase multiplying cells and a first set of the plurality of quadrature multiplying cells, the first output line combining output signals of the first set of in-phase multiplying cells and the first set of quadrature multiplying cells into a first output signal, and a second output line connected to a second set of the plurality of in-phase multiplying cells and a second set of the plurality of quadrature multiplying cells, the second output line combining output signals of the second set of in-phase multiplying cells and the second set of quadrature multiplying cells into a second output signal; and a radio frequency (RF) output transmission line connected to the first output line and the second output line, the RF output transmission line propagating an RF analog output signal based on the first output signal and the second output signal.

In some embodiments, the plurality of multiplying cells are integrated onto a common semiconductor core. The in-phase multiplying cells and the quadrature multiplying cells may be spatially interleaved on the common semiconductor core. In some embodiments, the in-phase multiplying cells and the quadrature multiplying cells are arranged in a K×M array of multiplying cells composed of K rows and M columns. The in-phase multiplying cells and the quadrature multiplying cells are arranged in a K×M array of multiplying cells composed of K rows and M columns. In some embodiments, K is an even integer greater than, or equal to, two and M is an odd integer selected such that the number of cells in the K×M array is greater than, or equal to, $2 \times (2^N - 1)$, where N is the number of in-phase bits, or quadrature bits, received by the I/Q D/A converter. For example, where K is equal to two (2), M will equal $2^N - 1$. Also, for arrays with two rows, the number of in-phase multiplying cells and the number of quadrature multiplying cells are both equal to M.

In some embodiments, the local oscillator module comprises an in-phase local oscillator transmission line connected to the in-phase multiplying cells that carries the in-phase local oscillator signal and a quadrature local oscillator transmission line connected to the quadrature multiplying cells that carries the quadrature local oscillator signal. In some embodiments, the I/Q D/A converter directly modulates the in-phase bits and the quadrature bits onto a radio frequency carrier.

The method for radio frequency D/A conversion of in-phase and quadrature bit streams may include propagating a digital input signal comprising a plurality of in-phase bits and a plurality of quadrature bits; feeding each of a plurality of in-phase multiplying cells an in-phase local oscillator signal and one of the plurality of in-phase bits; producing a plurality of in-phase analog output signals, each in-phase multiplying cells producing an in-phase analog output signal based on the received in-phase bit; feeding each of a plurality of quadrature multiplying cells a quadrature local oscillator signal and one of the plurality of quadrature bits; producing a plurality of quadrature analog output signals, each quadrature multiplying cells producing a quadrature analog output signal based on the received quadrature bit; combining, in phase, a first set of the plurality of in-phase analog output signals and a first set of the plurality of quadrature analog output signals to form a first analog signal; combining, in phase, a second set of the plurality of in-phase analog output signals and a second set of the plurality of quadrature analog output signals to form a second analog signal; and propagating the first analog signal and the second analog signal on output transmission lines.

In some embodiments, the method includes combining, in phase, the first analog signal and the second analog signal to form a combined output signal. In some embodiments, producing the plurality of in-phase analog output signals comprises directly modulating the in-phase bits onto a radio frequency carrier and producing the plurality of quadrature analog output signals comprises directly modulating the quadrature bits onto the radio frequency carrier.

The described features, structures, advantages, and/or characteristics of the subject matter of the present disclosure may be combined in any suitable manner in one or more embodiments and/or implementations. In the following description, numerous specific details are provided to impart a thorough understanding of embodiments of the subject matter of the present disclosure. One skilled in the relevant art will recognize that the subject matter of the present disclosure may be practiced without one or more of the specific features, details, components, materials, and/or methods of a particular embodiment or implementation. In other instances, additional features and advantages may be recognized in certain embodiments and/or implementations that may not be present in all embodiments or implementations. Further, in some instances, well-known structures, materials, or operations are not shown or described in detail to avoid obscuring aspects of the subject matter of the present disclosure. The features and advantages of the subject matter of the present disclosure will become more fully apparent from the following description and appended claims, or may be learned by the practice of the subject matter as set forth hereinafter.

BRIEF DESCRIPTION OF THE DRAWINGS

In order that the advantages of the subject matter may be readily understood, a more particular description of the subject matter briefly described above will be rendered by reference to specific embodiments that are illustrated in the appended drawings. Understanding that these drawings depict only typical embodiments of the subject matter and are not therefore to be considered to be limiting of its scope, the subject matter will be described and explained with additional specificity and detail through the use of the accompanying drawings, in which:

FIG. 6A is a block diagram illustrating one embodiment of an array of multiplying cells for an in-phase-and-quadrature multiplying core;

FIG. 6B is a block diagram illustrating another embodiment of an array of multiplying cells for an in-phase-and-quadrature multiplying core;

FIG. 6C is a block diagram illustrating another embodiment of an array of multiplying cells for an in-phase-and-quadrature multiplying core;

FIG. 7A is a table illustrating one embodiment of output signals produced by an in-phase-and-quadrature multiplying core;

FIG. 7B is a table illustrating another embodiment of output signals produced by an in-phase-and-quadrature multiplying core;

FIG. 7C is a table illustrating another embodiment of output signals produced by an in-phase-and-quadrature multiplying core;

DETAILED DESCRIPTION

Figure 1A:
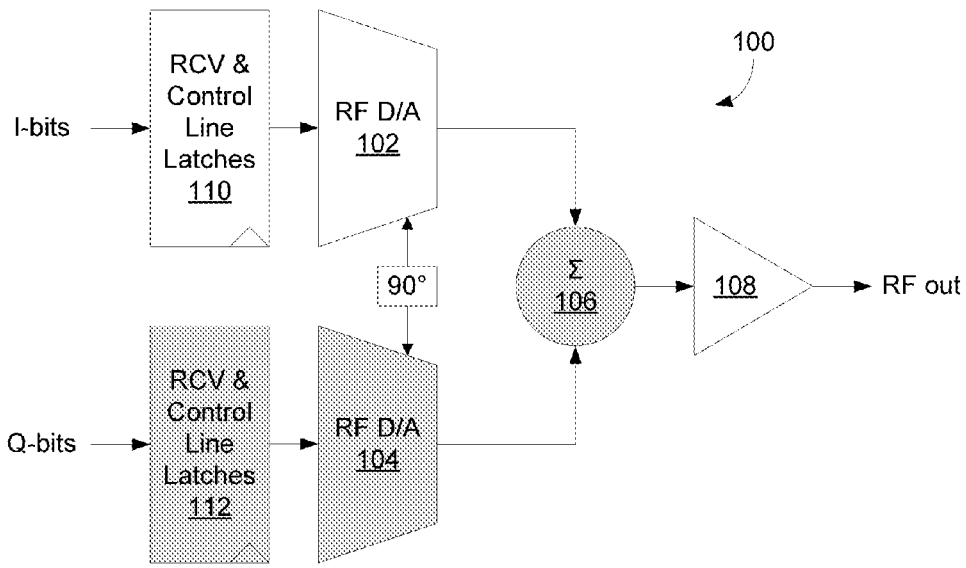
FIG. 1A is a schematic block diagram illustrating one embodiment of a prior art in-phase-and-quadrature digital-to-analog (D/A) converter.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Broadly, one embodiment of the present disclosure provides a direct "bits-to-RF" digital-to-analog (D/A) converter architecture for complex signals that supports the synthesis of high-bandwidth, digitally-modulated waveforms at an operating frequency including microwave and millimeter-wave frequencies. Complex signals can be defined as signals having in-phase and quadrature components. As used herein, the term "operating frequency" refers to radio frequencies in the microwave band, including millimeter-wave frequencies. Generally, microwave band frequencies may refer to frequencies between about 300 MHz (0.3 GHz) and 300 GHz, with a wavelength as long as one meter and as short as one millimeter. Millimeter-wave frequencies may refer to frequencies between about 30 GHz and 300 GHz, with a wavelength as long as 10 mm and as short as 1 mm when radiating in free space.

Direct bits-to-RF D/A converters can be useful wherever data or synthesized signals are being transmitted. For example, communications systems, such as satellites, televisions, cell phones, and wireless LAN, and the like, may employ embodiments of the in-phase-and-quadrature (I/Q) RF D/A converter described herein. The disclosed I/Q RF D/A converter may be used for D/A conversion with high digital data rates.

The I/Q RF D/A converter is also useful for power constrained or volume constrained applications in certain implementations. In particular, the disclosed I/Q RF D/A converter may be used in mobile electronic devices.

In some embodiments, the disclosed I/Q RF D/A converter uses traveling wave amplifier concepts to improve the frequency response and signal bandwidth that can be realized by an in-phase-and-quadrature D/A converter. The disclosed I/Q RF D/A converter architecture may include a set of identical multiplying unit cells having high and constant input and output impedances. The identical multiplying unit cells can be component matched. Such an architecture allows the RF output frequency to be scaled according to traveling wave concepts to achieve high bandwidth D/A conversion at the operating frequencies. In some implementations, the I/Q RF D/A converter allows in-phase digital signals and quadrature digital signals to be converted at the same time.

Furthermore, in certain implementations, the I/Q RF D/A converter can use spatial averaging to compensate for process error and achieve improved suppression of the image frequency, which can include the unwanted, aliased signal produced at the image frequency. Accordingly, the I/Q RF D/A converter can allow high resolution, complex signals to be synthesized at higher RF output frequencies than achieved in the prior art, for example, at millimeter-wave frequencies, without mixer up-conversion stages, and with a clock rate that can be much lower than the RF output frequency.

Applying traveling wave concepts to an in-phase-and-quadrature D/A converter greatly extends the bandwidth, output frequency, and resolution that can be achieved with a D/A converter. This combination of extended bandwidth, output frequency, and resolution can be enabled by the realization of multiplying cells having constant and high-valued terminal impedances.

FIG. 1A depicts an embodiment of a conventional D/A converter 100 capable of converting both in-phase and quadrature digital signals. The D/A converter 100 includes an in-phase D/A converter 102 that converts incoming in-phase bits into an in-phase analog RF output, a quadrature D/A converter 104 that converts incoming quadrature bits into a quadrature analog RF output, a RF signal summation circuit 106 that combines the quadrature analog RF output and the in-phase analog RF output, and an amplifier 108 that amplifies the combined RF analog signal to appropriate levels. In some implementations, the D/A converter 100 includes an in-phase receive-and-latch block 110 and a quadrature receive-and-latch block 112. In yet some implementations, the D/A converter 100 includes image rejecting filter circuits (not shown) for suppressing the aliased signal. For example, the filter circuits may be located after each of the in-phase D/A converter 102 and quadrature D/A converter 104 or after the signal summation circuit 106. While effective at synthesizing complex I/Q RF signals, the D/A converter 100 doubles the complexity of the D/A converter. Further, the D/A converter 100 introduces matching challenges between the in-phase channel and the quadrature channel.

Figure 1B:
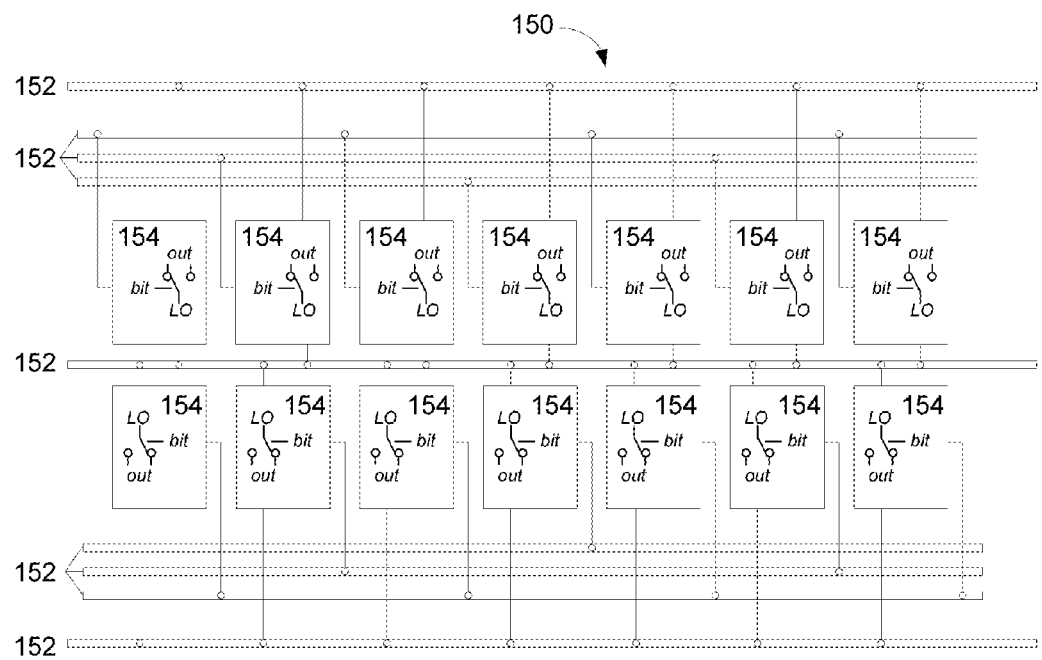
FIG. 1B is a schematic block diagram illustrating one embodiment of a prior art traveling wave, multiplying D/A converter.

FIG. 1B depicts an embodiment of a traveling wave, multiplying (TWM) D/A converter 150 capable of high frequency RF analog output. The TWM D/A converter 150 has propagation-delay matched transmission lines 152 and a plurality of identical, high-impedance multiplying cells 154 that are component-matched to improve conversion linearity and propagation-delay matching. The TWM D/A converter 150 provides direct "bits-to-RF" D/A conversion over wide bandwidths at the operating frequencies. One implementation of the TWM D/A converter 150 is disclosed in U.S. Pat. No. 6,952,177, which is hereby incorporated by reference in its entirety.

In contrast to the prior art, the I/Q D/A converter of the present disclosure integrates in-phase and quadrature multiplying cells in a traveling wave, multiplying D/A converter architecture to include the quadrature channel while minimizing growth (e.g., expansion) of the D/A converter core.

Figure 2:
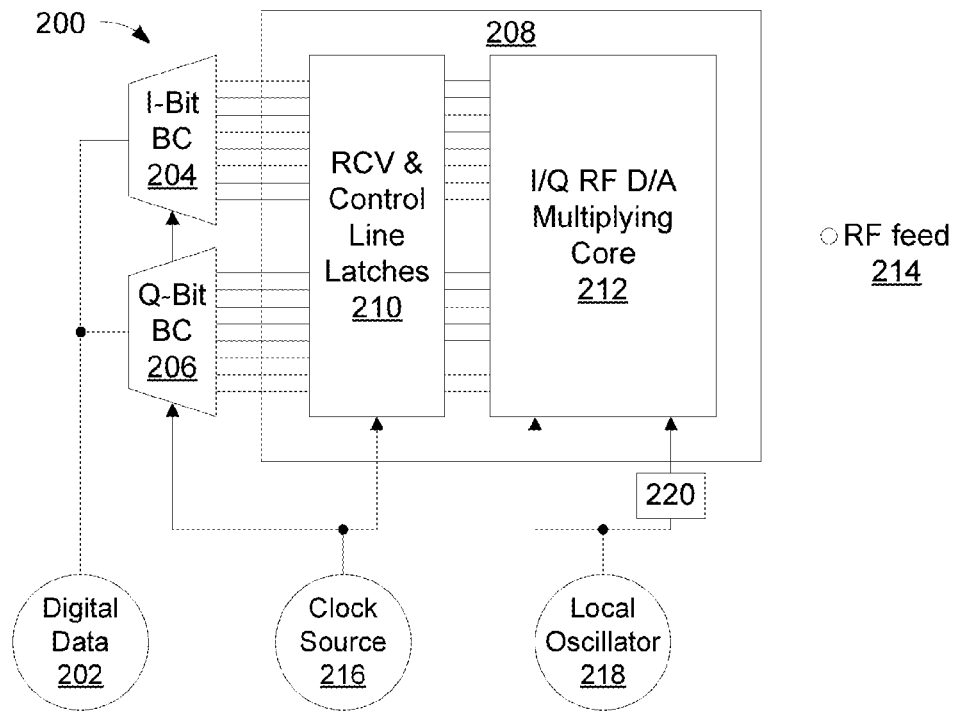
FIG. 2 is a schematic block diagram illustrating one embodiment of a system for radio frequency D/A conversion of in-phase and quadrature bit streams.

FIG. 2 depicts a system 200 for radio frequency (RF) D/A conversion of in-phase and quadrature bit streams, according to embodiments of the disclosure. The system 200 includes a digital data source 202, an in-phase-and-quadrature (I/Q) RF D/A converter 208, a system clock source 216, and a local oscillator 218. In some embodiments, the system 200 also includes an in-phase bit conditioner (BC) 204, a quadrature bit conditioner (BC) 206, and a phase delay 220. The system 200 produces a wide bandwidth RF analog output 214. Typically, the RF analog output 214 is at the operating frequency.

The digital data source 202, in one embodiment, provides input bit streams of both in-phase digital data and quadrature digital data. The input bit streams include a plurality of data words, each data word having a bit length of n. In some embodiments, the digital data source 202 provides serial digital data. The in-phase BC 204 and the quadrature BC 206 convert a data word from the in-phase or quadrature bit stream, respectively, into a plurality of bit inputs. In some embodiments, the data word contains N bits, each bit of the data word being sent on one bit input. Thus, the in-phase BC 204 and the quadrature BC 206 may each send N bits in parallel to the I/Q RF D/A converter 208. In other embodiments, the data word contains L bits and the BCs 204 and 206 each send out N bits. For example, L may equal one (1) and the BCs 204 and 206 may be serial-to-parallel converters operating on the input bit streams. As another example, L may be less than N (but greater than one) and the BCs 204 and 206 may be demultiplexers. As yet another example, L may be greater than N and the BCs 204 and 206 may be multiplexers. Additionally, while the BCs 204 and 206 are depicted as identical circuits, in some embodiments, the BCs 204 and 206 may differ from one another. For example, the in-phase BC 204 may be a demultiplexer circuit, while the quadrature BC 206 may be a multiplexer circuit.

The input data rate of the digital data source 202 may be significantly slower than the local oscillator signal. For example, an input data rate of 1 GHz and a local oscillator signal of 12.1 GHz would result in an RF analog output 214 centered at 12.1 GHz and having a bandwidth of 1 GHz. In some embodiments, the input data rate may be adjusted so that the I/Q RF D/A converter 208 produces an RF analog output 214 in a desired frequency band or channel. A digital data source 202 with an adjustable input data rate allows for a simplified local oscillator 218, which may reduce the cost of the system 200.

The I/Q RF D/A converter 208, in one embodiment, provides direct "bits-to-RF" conversion of the in-phase and quadrature input bit streams. The I/Q RF D/A converter 208 includes a receive-and-latch block 210 and an in-phase and quadrature (I/Q) radio frequency (RF) D/A multiplying core 212. The receive-and-latch block 210 can be RCV & control line latches. The I/Q RF D/A converter 208 receives in-phase and quadrature input bit streams from the digital data source 202, a clock signal from the system clock source 216, a local oscillator signal from the local oscillator 218, and produces an RF analog output 214. The I/Q RF D/A converter 208 is discussed in further detail below with reference to FIG. 3.

The receive-and-latch block 210 receives input bits in parallel from the digital data source 202, the in-phase BC 204, and/or the quadrature BC 206 and passes them on to the I/Q RF D/A multiplying core 212. The I/Q RF D/A multiplying core 212 multiplies a continuous in-phase local oscillator signal from the local oscillator 218 by the in-phase bits and multiplies a continuous quadrature local oscillator signal from the local oscillator 218 by a single quadrature bit. The receive-and-latch block 210 is discussed in further detail below with reference to FIG. 3. The I/Q RF D/A multiplying core 212 directly converts the input bits into an RF analog signal. The I/Q RF D/A multiplying core 212 is also discussed in further detail below with reference to FIG. 3.

The system clock source 216 provides a clock signal to the receive-and-latch block 210 and, when present, the in-phase BC 204 and quadrature BC 206. The clock signal has a frequency greater than the bandwidth of the digital data source. In some embodiments, the clock signal has a frequency greater than twice the bandwidth of the digital data source.

The local oscillator 218 provides an in-phase local oscillator signal and a quadrature local oscillator signal to the I/Q RF D/A multiplying core 212. Both the in-phase and the quadrature local oscillator signals are radio frequency signals. As the I/Q RF D/A converter 208 eliminates the need for an intermediate frequency stage and a separate frequency up-conversion stage, the local oscillator 218 provides local oscillator signals near the carrier frequency of the RF analog output 214. The quadrature local oscillator signal is phase offset by 90° from the in-phase local oscillator signal. In some embodiments, the local oscillator 218 produces the in-phase local oscillator signal independently from the quadrature local oscillator signal. In other embodiments, the local oscillator 218 includes a phase delay that retards the phase of the in-phase local oscillator signal to produce the quadrature local oscillator signal.

In some embodiments, the local oscillator 218 provides the in-phase local oscillator signal to the phase delay 220 which produces the quadrature local oscillator signal. The phase delay 220 is configured to delay the phase an incoming local oscillator signal by 90° and to provide the phase-delayed signal to the I/Q RF D/A multiplying core 212.

Figure 3:
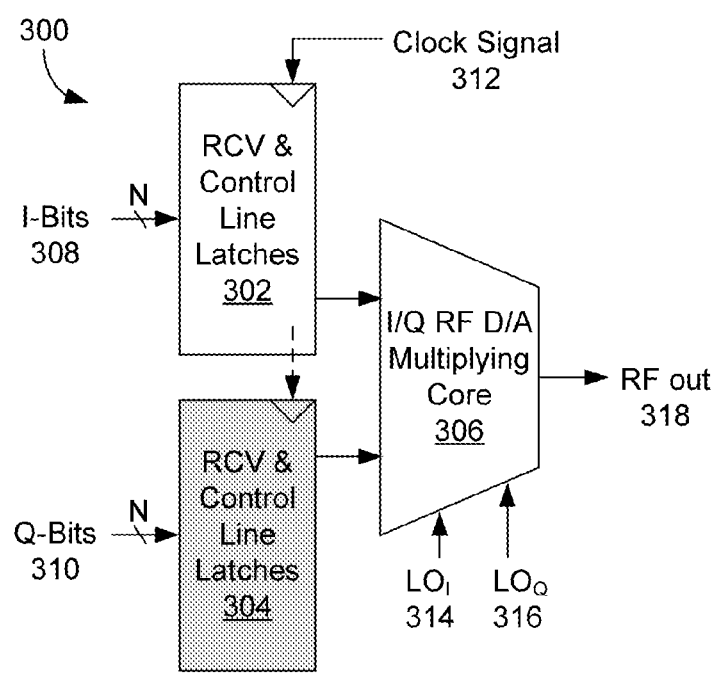
FIG. 3 is a schematic block diagram illustrating one embodiment of an apparatus for radio frequency D/A conversion of in-phase and quadrature bit streams.

FIG. 3 depicts an apparatus 300 for radio frequency D/A conversion of in-phase and quadrature bit streams. In some implementations, the apparatus 300 corresponds to the in-phase-and-quadrature RF D/A converter 208 described above with reference to FIG. 2. The apparatus 300 includes an in-phase receive-and-latch block 302, a quadrature receive-and-latch block 304, and an in-phase and quadrature (I/Q) radio frequency (RF) multiplying core 306. The receive-and-latch blocks 302 and 304 receive, respectively, N in-phase input bits 308 in parallel from an in-phase digital source and N quadrature input bits 310 in parallel from a quadrature digital source. The receive-and-latch blocks 302 and 304 provide latched input bits, both in-phase and quadrature, to the I/Q RF multiplying core 306. The I/Q RF multiplying core 306 comprises a plurality of multiplying cells and performs direct bits-to-RF conversion of the input bits. Notably, the direct bits-to-RF conversion performed by the apparatus 300 eliminates the need for an intermediate frequency stage and a separate frequency up-conversion stage, thereby reducing the cost, bulk, and complexity of the apparatus 300.

The in-phase receive-and-latch block 302 receives N in-phase input bits 308 in parallel from the in-phase digital source and latches them based on a clock signal 312. The clock signal 312 can be at or above the Nyquist frequency needed for accurate conversion of the digital signal. The in-phase receive-and-latch block 302 provides the latched in-phase bits to a plurality of multiplying cells in the I/Q RF multiplying core 306 such that each of the N in-phase input bits is received by at least one multiplying cell in the I/Q RF multiplying core 306.

The quadrature receive-and-latch block 304 receives N quadrature input bits 310 in parallel from the quadrature digital source and latches them based on a clock signal 312. In some embodiments, the clock signal 312 has the same phase at both the in-phase receive-and-latch block 302 and the quadrature receive-and-latch block 304. The quadrature receive-and-latch block 304 provides the latched quadrature bits to a plurality of multiplying cells in the I/Q RF multiplying core 306 such that each of the N quadrature input bits is received by at least one multiplying cell in the I/Q RF multiplying core 306.

The I/Q RF multiplying core 306, in one embodiment, comprises a plurality of multiplying cells, each multiplying cell receiving one of the N in-phase bits from the in-phase receive-and-latch block 302 or one of the N quadrature bits from the quadrature receive-and-latch block 304. The I/Q RF multiplying core 306 also receives an in-phase local oscillator signal 314, and a quadrature local oscillator signal 316. Multiplying cells receiving an in-phase bit also receive the in-phase local oscillator signal 314, while multiplying cells receiving a quadrature bit also receive the quadrature local oscillator signal 316. The I/Q RF multiplying core 306 multiplies the in-phase bits with the in-phase local oscillator signal and the quadrature bits with the quadrature local oscillator signal. The I/Q RF multiplying core 306 modulates local oscillator signals with the input bits to form the RF analog output signal 318, as discussed in further detail below with reference to FIG. 4.

When compared to a non-I/Q RF D/A converter, the apparatus 300 also includes the receive-and-latch block 304 and the local oscillator input 316. This extra circuitry is used to support the additional input bits required by the I/Q RF multiplying core 306. Additionally, since the frequency of operation is principally set by the analog circuitry, the performance of the apparatus 300 is not affected by the extra digital components, which can include the extra receive-and-latch block 304 and local oscillator input 316.

Figure 4:
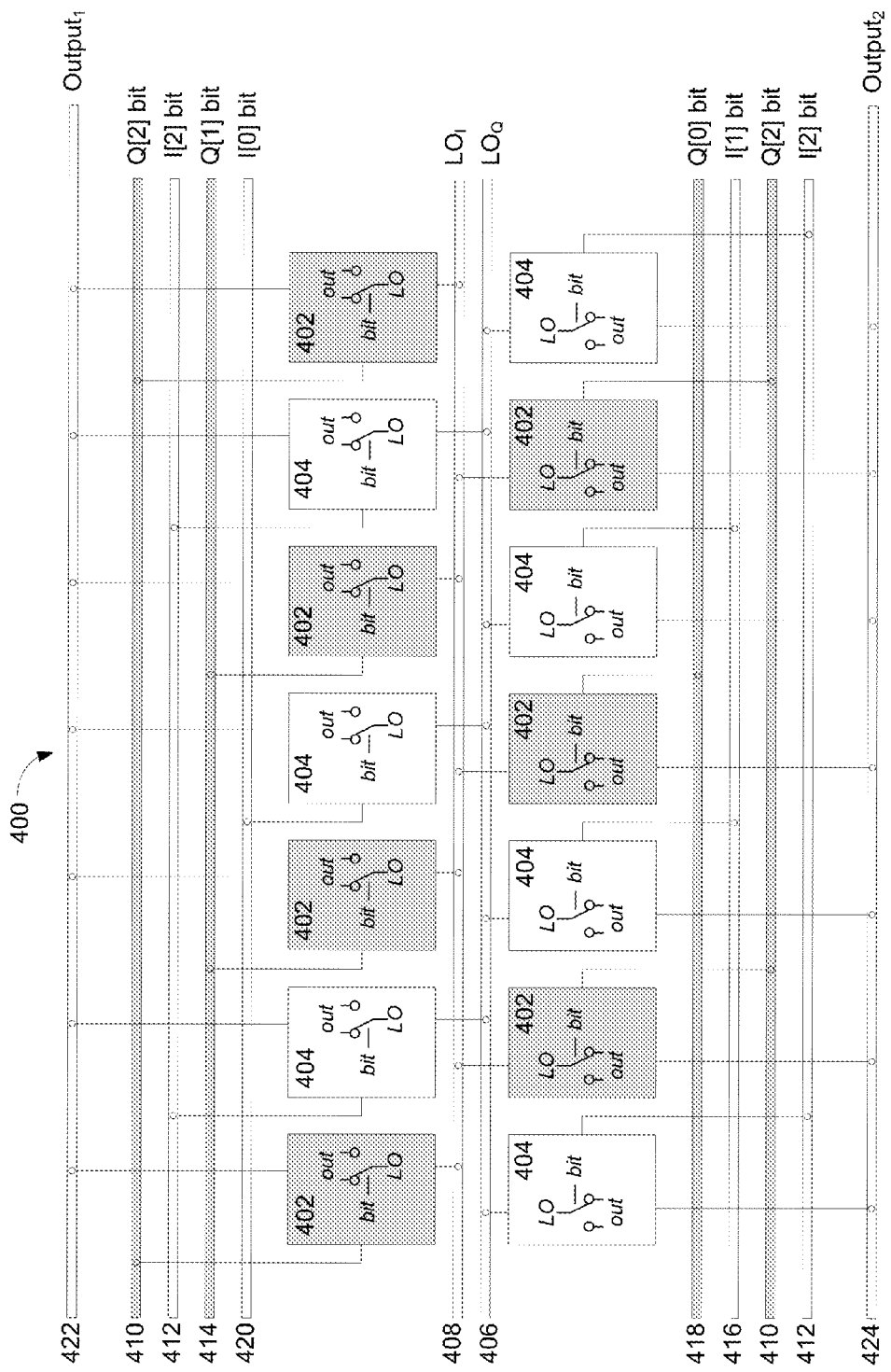
FIG. 4 is a schematic block diagram illustrating one embodiment of an in-phase-and-quadrature multiplying core.

FIG. 4 depicts a block diagram of I/Q multiplying core 400 according to embodiments of the disclosure. The I/Q multiplying core 400, as depicted, is a three bit embodiment of the I/Q RF D/A multiplying core 212 and the I/Q RF multiplying core 306 described above with reference to FIGS. 2 and 3. Although only three bits are depicted in the I/Q multiplying core 400 for simplicity, it is understood that the I/Q multiplying core 400 may include any number of bits. The I/Q multiplying core 400 includes the same array of multiplying cells 154 as the TWM D/A converter 150 depicted in FIG. 1B above. However, in the I/Q multiplying core 400, the multiplying cells are divided into a plurality of quadrature multiplying cells 402 and a plurality of in-phase multiplying cells 404.

The width of the I/Q multiplying core 400 is proportional to the number of input bits and is unchanged compared to the TWM D/A converter 150, therefore the design of the transmission lines in the I/Q multiplying core 400 is the same as in the TWM D/A converter 150. The height of the I/Q multiplying core 400 is affected by the number of input bit transmission lines and the height of the I/Q multiplying core 400 is greater than that of the TWM D/A converter 150 due to the extra control lines, which can include the extra local oscillator transmission line 408 and the additional input bit lines. Any added capacitances at the inputs or outputs of the multiplying cells 402, 404 from the longer lengths can be compensated by the propagation characteristics of the transmission lines 406-424. The achievable frequency performance of the I/Q multiplying core 400 can be the same as the TWM D/A converter 150.

Each of the quadrature multiplying cells 402, in one embodiment, includes circuitry configured to convert an input bit into a RF signal. The quadrature multiplying cells 402 are component matched and have large, constant impedances. Each quadrature multiplying cell 402 is connected to the quadrature local oscillator transmission line 406 and to one of the quadrature input bit lines 410, 414, 418. Each of the quadrature input bit lines 410, 414, 418 is connected to at least one quadrature multiplying cell 402.

As depicted, the I/Q multiplying core 400 includes a binary-weighted number of quadrature multiplying cells 402 for each input bit. As used herein, "binary-weighted" refers to the weight given to the significance of the bit, for example the bit position. Thus, the binary-weighted number of quadrature multiplying cells 402 refers to the number of quadrature multiplying cells 402 connected to each input bit, the number based on the significance of the bit. The binary-weighted number is equal to $2^W$, where W is an integer representing the significance of the bit. For example, the binary-weighted number for the least significant bit—the zero (0) bit position—is equal to one, or $2^0$ and the binary-weighted number for the most significant bit in a three bit implementation—the two (2) bit position—is equal to four, or $2^2$.

Accordingly, the quadrature input bit line 410 provides an input to four quadrature multiplying cells 402, the quadrature input bit line 414 provides an input to two quadrature multiplying cells 402, and the quadrature input bit line 418 provides an input to one quadrature multiplying cell 402. Each input bit line is connected to a weighted number of quadrature multiplying cell 402 so that, upon combining output signals, each bit is given the expected weight in a D/A conversion.

Each quadrature multiplying cell 402 multiplies a quadrature local oscillator signal ($LO_Q$) by the bit value provided by one of the quadrature input bit lines 410, 414, 418. Each quadrature multiplying cell 402 produces an analog output signal based on the state of the digital input. In some embodiments, each quadrature multiplying cell 402 produces balanced differential output. In some embodiments, the quadrature multiplying cell 402 is a bit-operated current switch. In other embodiments, the quadrature multiplying cell 402 is an active mixer. In further embodiments, the quadrature multiplying cell 402 may be a multiplying "unit cell" as described in U.S. Pat. No. 6,952,177.

Each of the in-phase multiplying cells 404, in one embodiment, includes circuitry configured to convert an input bit into a RF signal. The in-phase multiplying cells 404 are component matched and have large, constant impedances. Each in-phase multiplying cell 404 is connected to the in-phase local oscillator transmission line 408 and to one of the in-phase input bit lines 412, 416, 420. Each of the in-phase input bit lines 412, 416, 420 is connected to at least one in-phase multiplying cell 404.

As depicted, the I/Q multiplying core 400 includes a binary-weighted number of in-phase multiplying cells 404 for each input bit. Accordingly, the in-phase input bit line 412 provides an input to four in-phase multiplying cells 404, the in-phase input bit line 416 provides an input to two in-phase multiplying cells 404, and the in-phase input bit line 420 provides an input to one in-phase multiplying cell 404. Each input bit line is connected to a weighted number of in-phase multiplying cell 404 so that, upon combining output signals, each bit is given the expected weight in a D/A conversion.

Each in-phase multiplying cell 404 multiplies an in-phase local oscillator signal ($LO_I$) by the bit value provided by one of the in-phase input bit lines 412, 416, 420. Each in-phase multiplying cell 404 produces an analog output signal based on the state of the digital input. In some embodiments, each in-phase multiplying cell 404 produces balanced differential output. In some embodiments, the in-phase multiplying cell 404 is a bit-operated current switch. In other embodiments, the in-phase multiplying cell 404 is an active mixer. In further embodiments, the in-phase multiplying cell 404 may be a multiplying "unit cell" as described in U.S. Pat. No. 6,952,177.

The quadrature local oscillator transmission line 406, in one embodiment, propagates a quadrature local oscillator signal ($LO_Q$) to the quadrature multiplying cells 402. In some embodiments, the quadrature local oscillator signal ($LO_Q$) is a sinusoidal local oscillator current superimposed on a DC bias. In some embodiments, the quadrature local oscillator transmission line 406 comprises a pair of transmission lines and the quadrature local oscillator signal ($LO_Q$) is a differential signal.

The in-phase local oscillator transmission line 408, in one embodiment, propagates an in-phase local oscillator signal ($LO_I$) to the in-phase multiplying cells 404. In some embodiments, the in-phase local oscillator signal ($LO_I$) is a sinusoidal local oscillator current superimposed on a DC bias. In some embodiments, the in-phase local oscillator transmission line 408 comprises a pair of transmission lines and the quadrature local oscillator signal ($LO_I$) is a differential signal.

The quadrature bit transmission lines 410, 414, 418, in one embodiment, are transmission lines configured to propagate quadrature bit values Q[2], Q[1], and Q[0], respectively, to a binary-weighted number of quadrature multiplying cells 402. The Q[2] bit line 410 propagates the most significant quadrature bit to four quadrature multiplying cells 402. The Q[1] bit line 414 propagates the second most significant quadrature bit to two quadrature multiplying cells 402. The Q[0] bit line 418 propagates the least significant quadrature bit to one quadrature multiplying cell 402. The most significant quadrature bit can be the Q[2] bit, the second most significant quadrature bit can be the Q[1] bit, and the least significant quadrature bit can be the Q[0] bit.

The in-phase bit transmission lines 412, 416, 420, in one embodiment, are transmission lines configured to propagate in-phase bit values I[2], I[1], and I[0], respectively, to a binary-weighted number of in-phase multiplying cells 404. The I[2] bit line 412 propagates the most significant in-phase bit to four in-phase multiplying cells 404. The I[1] bit line 416 propagates the second most significant in-phase bit to two in-phase multiplying cells 404. The I[0] bit line 420 propagates the least significant in-phase bit to one in-phase multiplying cell 404. The most significant in-phase bit can be the I[2] bit, the second most significant in-phase bit can be the I[1] bit, and the least significant in-phase bit can be the I[0] bit.

FIG. 4 depicts a simplified design of the I/Q multiplying core 400 with four bit transmission lines connected to multiplying cells 402 and 404 on the upper row and four bit transmission lines connected to multiplying cells 402 and 404 on the lower row. Only bit transmission lines connecting to a multiplying cell are present to reduce the core height. In other embodiments, the I/Q multiplying core 400 may have one each of bit transmission lines 410-420 above the upper row of multiplying cells and one each of bit transmission lines 410-420 below the lower row of multiplying cells. The additional bit transmission lines, while not connected to multiplying cells on the row, prevent asymmetrical interference between the upper and lower halves of the I/Q multiplying core 400 and due to e.g., cross-talk on the bit transmission lines. Asymmetrical interference can be an error.

The first output line 422 is a transmission line configured to propagate RF analog output signals produced by a first set of the quadrature multiplying cells 402 and a first set of the in-phase multiplying cells 404. As depicted, the first output line 422 receives an RF analog output signal from four quadrature multiplying cells 402 and three in-phase multiplying cells 404. The first set of the quadrature multiplying cells 402 and first set of the in-phase multiplying cells 404 are arranged so that their outputs combine in phase on the first output line 422. In some embodiments, the first output line 422 comprises a pair of transmission lines and each multiplying cell in the first set of the quadrature multiplying cells 402 and first set of the in-phase multiplying cell 404 produces a differential signal. In certain embodiments, the multiplying cell outputs are biased to provide an appropriate load impedance.

The second output line 424 is a transmission line configured to propagate RF analog output signals produced by a second set of the quadrature multiplying cells 402 and a second set of the in-phase multiplying cells 404. As depicted, the second output line 424 receives an RF analog output signal from three quadrature multiplying cells 402 and four in-phase multiplying cells 404. The second set of the quadrature multiplying cells 402 and second set of the in-phase multiplying cells 404 are arranged so that their outputs combine in phase on the second output line 424. In some embodiments, the second output line 424 comprises a pair of transmission lines and each multiplying cell in the second set of the quadrature multiplying cells 402 and second set of the in-phase multiplying cells 404 produces a differential signal. The RF signals of the first output line 422 and the second output line 424 are later combined to produce an RF feed signal, such as the RF analog output 214 or the RF analog output signal 318. In some embodiments, the first output line 422 and the second output line 424 are combined using traveling wave principles so that the RF outputs combine in phase, thus eliminating the need of summation circuits. In certain embodiments, the first output line 422 has the same propagation velocity as the second output line 424.

The local oscillator transmission lines 406, 408 and the output lines 422, 424 have the same propagation velocities so that the output signals from each of the multiplying cells 402, 404 will combine in phase—e.g., producing RF analog output 214—as each local oscillator to output path will see the same overall delay. The output path can be a path from local oscillator 218 to the RF analog output 214.

The quadrature multiplying cells 402 and the in-phase multiplying cells 404 are arranged into two rows, the number of multiplying cells in a row corresponding to $2^N-1$, where N is number of bits in the digital input signal. As depicted, in the three-bit implementation, the quadrature multiplying cells 402 and the in-phase multiplying cells 404 form a 2×7 array of multiplying cells. The seven quadrature multiplying cells 402 are staggered between the upper row and the lower row of the array of multiplying cells. Likewise, the seven in-phase multiplying cells 404 are staggered between the upper and lower rows of the array. As depicted, the quadrature multiplying cells 402 are interleaved with the in-phase multiplying cells 404 to spatially average any linear gradients across the array. Such gradients may result, for example, from process, temperature or electrical limitations and may defeat the linearity of the D/A conversion at first output line 422 and/or second output line 424. The limitations may be signal attenuation.

Additionally, the input bits are interleaved across the array of multiplying cells in the I/Q multiplying core 400. The middle cell in each row receives the least significant bit. The middle cell can be the fourth cell. The second least significant bit is received by the multiplying cells adjacent to the middle cell and the most significant bit is received by the outer cells. Thus, the bit positions in the I/Q multiplying core 400 exhibit horizontal symmetry about the middle cell of each row. The least significant bit can be either the I[0] bit or the Q[0] bit, and the most significant bit can be the I[2] bit or the Q[2] bit.

The symmetry of the multiplying cells 402, 404 in the I/Q multiplying core 400 compensate for any linear gradient across the I/Q multiplying core 400 and cancels out delay error due process, temperature, and electrical limitations or the like. Additionally, the symmetrically staggered cells distribute error in consistent and correctable ways. The two output lines 422, 424 aid in suppressing error as the symmetrical distribution of error across array of interleaved multiplying cells 402, 404 cause the error to cancel out upon combining. When summed, the current contributions cancel out the gradient error due to the bit-wise interleaving of the multiplying cells 402, 404. Interleaving offers a spatial averaging which maintains linearity of the D/A conversion and equalizes gain for both the in-phase and quadrature paths.

The inability to adequately suppress the image frequency (e.g., the aliased signal) is a primary limiter in most direct conversion architectures. Image rejection, the ability to suppress or reject the aliased signal, is limited by the gain and the phase differences in the in-phase and quadrature paths. For small mismatches, the Image Rejection Ratio (IRR) may be expressed as $(g^2+p^2)/4$ where g is the gain mismatch and p is the phase mismatch (in radians). Thus, slight differences in gain and/or phase between the two paths can result in significant performance degradation. For example, a relative voltage gain mismatch of 5% and a phase offset of 5° result in an IRR reduction of 26 dB.

The symmetry of the I/Q multiplying core 400 is key to matching gain error, thus improving image rejection. The quadrature multiplying cells 402 and the in-phase multiplying cells 404 are interleaved so that any mismatches from process or timing are averaged across the array of multiplying cells. The interleaving results in spatial averaging of the error and minimizes performance degradation, as discussed below with reference to FIGS. 6A-6C and 7A-7C.

Phase offset between the in-phase and quadrature paths are naturally suppressed in a well-designed traveling-wave architecture. As discussed above, with reference to FIG. 4, the quadrature multiplying cells 402 and the in-phase multiplying cells 404 are designed so that their outputs combine in phase at the output lines 422, 424. Thus propagation delays between the local oscillator transmission lines 406, 408 and the output lines 422, 424 are matched at each of the quadrature multiplying cells 402 and in-phase multiplying cells 404 so that a plurality of output signals from each multiplying cell 402, 404 will combine in phase on the output transmission line. Output signals from all like multiplying cells, such as the quadrature multiplying cells 402 or the in-phase multiplying cells 404, will combine in phase if the local oscillator and output lines have the same propagation velocities. Additionally, the architecture of the I/Q multiplying core 400 allows the quadrature phase difference is preserved along the transmission with no added effect. The quadrature phase difference can be the 90° offset from the in-phase component.

Figure 5:
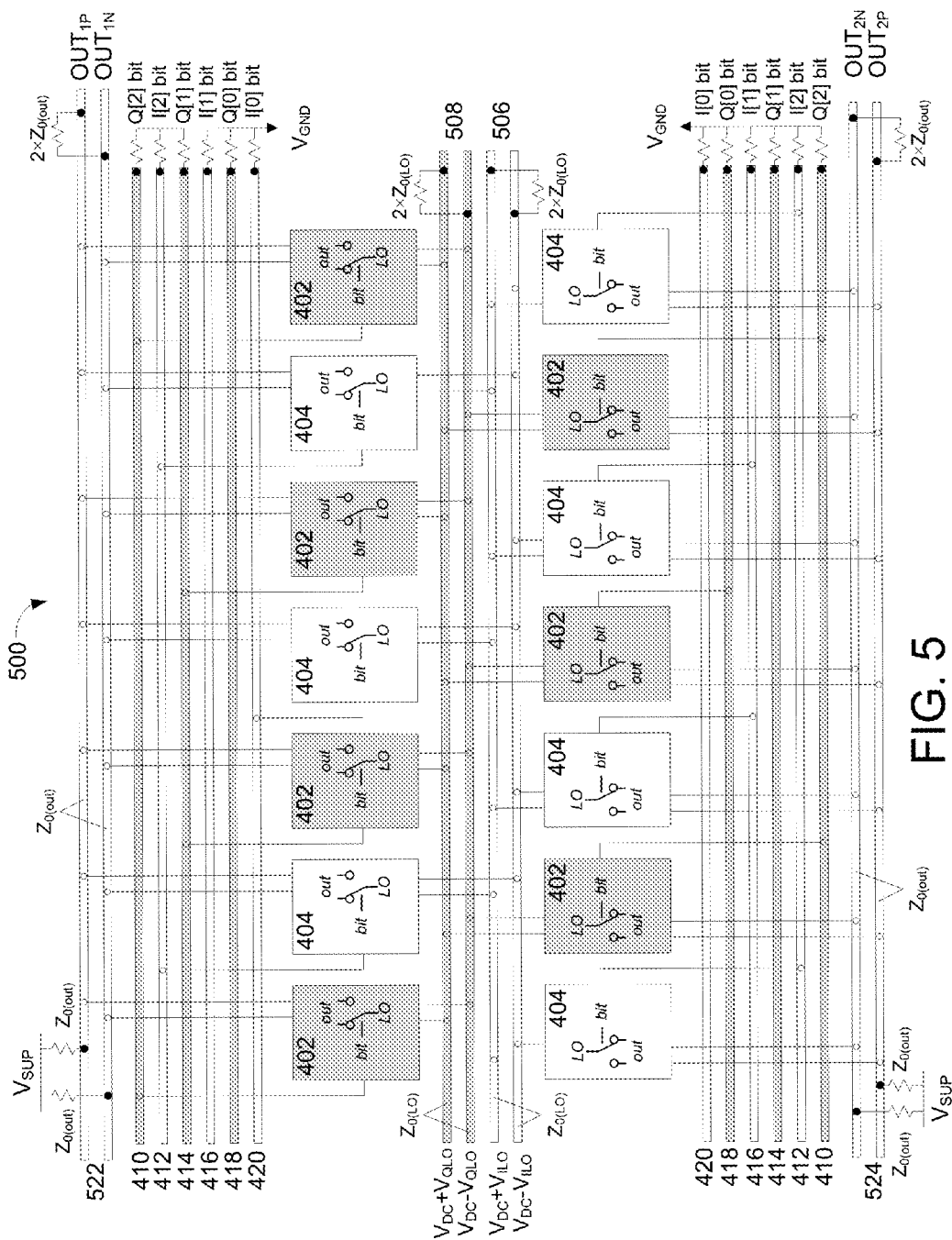
FIG. 5 is a schematic block diagram illustrating another embodiment of an in-phase-and-quadrature multiplying core.

FIG. 5 depicts a block diagram of an I/Q multiplying core 500 according to some embodiments of the disclosure. The I/Q multiplying core 500 is an expanded implementation of the I/Q multiplying core 400, described above with reference to FIG. 4. Although only three bits are depicted in the I/Q multiplying core 500 for simplicity, it is understood that the I/Q multiplying core 500 may include any number of bits. The I/Q multiplying core 500 includes the same array of multiplying cells 402 and 404 as the I/Q multiplying core 400 depicted in FIG. 1B above. However, in the I/Q multiplying core 500, differential signaling is used.

Each quadrature multiplying cell 402 is connected to a pair of quadrature local oscillator transmission lines 506 and each in-phase multiplying cell 404 is connected to a pair of in-phase local oscillator transmission lines 508. As depicted, the upper row of multiplying cells 402, 404 is connected to a first pair of output transmission lines 522 and the lower row of multiplying cells 402, 404 is connected to a second pair of output transmission lines 524. Additionally, the I/Q multiplying core 500 includes one each of the bit transmission lines 410-420 above the upper row of multiplying cells 402, 404 and one each of the bit transmission lines 410-420 below the lower row of multiplying cells 402, 404.

The terminal impedances of the multiplying cells 402, 404 should be much greater (e.g., by a factor of 10 or more) than the characteristic impedance, $Z_0$, of the output transmission lines 522, 524. In some implementations, the terminal impedances of the multiplying cells 402, 404 is greater than, by a factor of 10 or more, the characteristic impedance, $Z_0$, of the output transmission lines 522, 524. Additionally, any capacitances at the inputs and outputs of the multiplying cells 402, 404 can be absorbed into the characteristic impedances $Z_0$ of the output transmission lines 522, 524, allowing very high frequencies to be handled by the I/Q multiplying core 500. For example, the architecture allows the frequencies to be scaled to accommodate millimeter-wave frequencies.

Figures 6A, 6B, 6C:
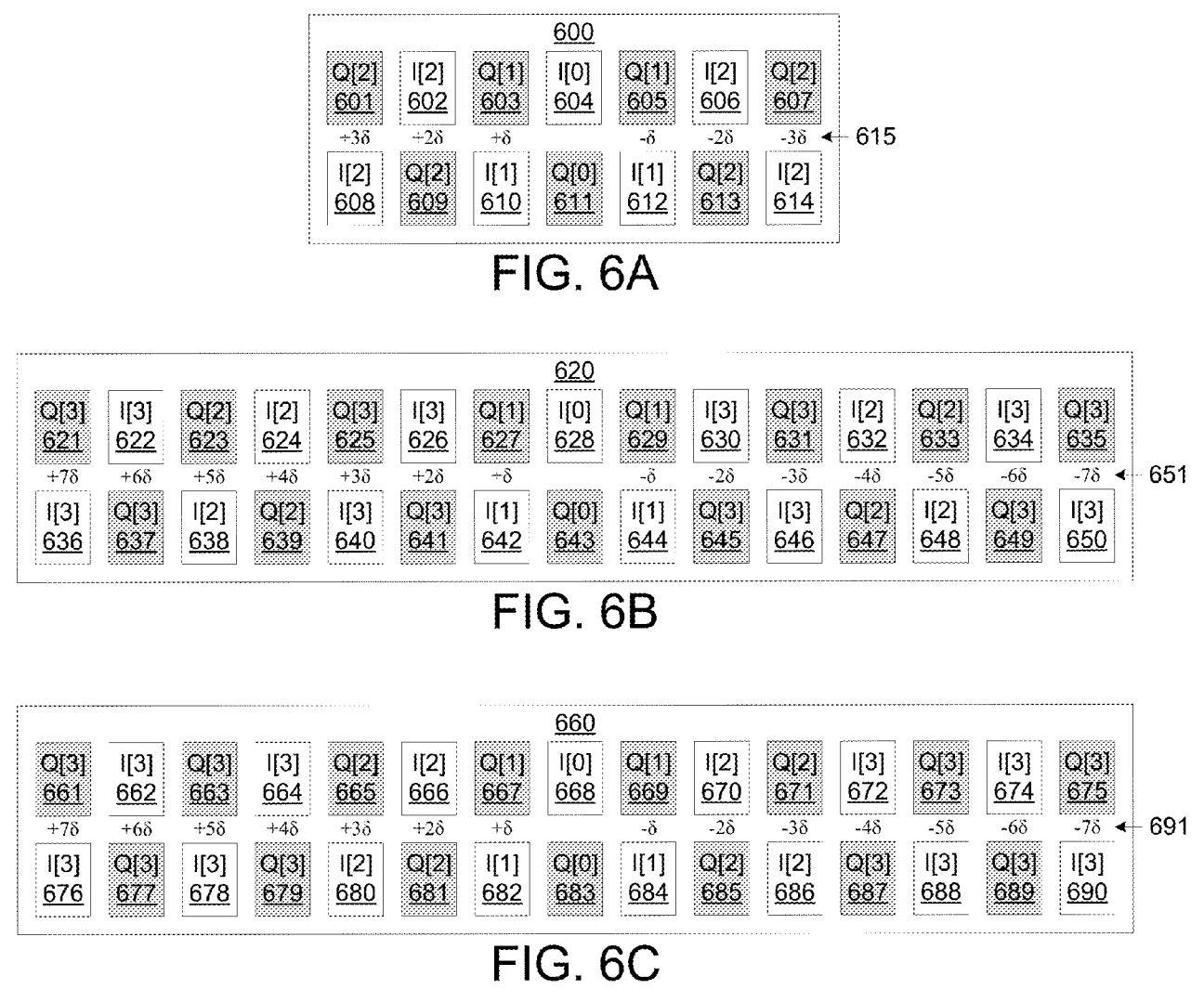

FIGS. 6A-6C depict arrays of multiplying cells, according to embodiments of the disclosure. FIG. 6A depicts an array 600 of multiplying cells 601-614 in a three-bit implementation of an I/Q RF D/A converter, such as the I/Q RF D/A multiplying core 212, the I/Q RF multiplying core 306, the I/Q multiplying core 400, and/or the I/Q multiplying core 500. FIG. 6B depicts an array 620 of multiplying cells 621-650 in a four-bit implementation of an I/Q RF D/A converter, such as the I/Q RF D/A multiplying core 212, the I/Q RF multiplying core 306, the I/Q multiplying core 400, and/or the I/Q multiplying core 500. FIG. 6C depicts an array 660 of multiplying cells 661-690 in a four-bit implementation of an I/Q RF D/A converter, such as the I/Q RF D/A multiplying core 212, the I/Q RF multiplying core 306, the I/Q multiplying core 400, and/or the I/Q multiplying core 500.

The multiplying cell array 600 includes a 2×M array, with M equal to seven, of interleaved in-phase and quadrature multiplying cells 601-614. The multiplying cell array 600 exhibits horizontal symmetry about the multiplying cells 604 and 611, which can be the middle cells in the array. The in-phase and quadrature multiplying cells of the multiplying cell array 600 are interleaved to achieve spatial averaging of error and to suppress the image frequency (e.g., the aliased signal), as discussed above with reference to FIG. 4.

Four multiplying cells 601, 607, 609, 613 receive the most significant quadrature bit (Q[2]), two multiplying cells 603, 605 receive the next most significant quadrature bit (Q[1]), and one multiplying cell 611 receives the least significant quadrature bit (Q[0]). Four multiplying cells 602, 606, 608, 614 receive the most significant in-phase bit (I2]), two multiplying cells 610, 612 receive the next most significant in-phase bit (I[1]), and one multiplying cell 604 receives the least significant in-phase bit (I[0]). As depicted, each quadrature bit and each in-phase bit is received by a binary-weighted number of multiplying cells.

The multiplying cell array 600 experiences gradient error 615 causing attenuation of the local oscillator signal from left to right across the multiplying cell array 600 such that the amplitude of the local oscillator current decreases by a factor δ from one multiplying cell to an adjacent multiplying cell. Due to the symmetry of the multiplying cell array 620, the linearity of the D/A conversion is preserved and the image frequency is suppressed, as discussed in further detail below with reference to FIG. 7A.

The multiplying cell array 620 comprises a 2×M array, with M equal to fifteen, of interleaved in-phase and quadrature multiplying cells 621-650. The multiplying cell array 620 receives four quadrature bits Q[3], Q[2], Q[1], and Q[0], which are listed in decreasing order of significance, and four in-phase bits I[3], I[2], I[1], and I[0], which also are listed in decreasing order of significance. Each quadrature bit and each in-phase bit is received by a binary-weighted number of multiplying cells. The multiplying cell array 620 exhibits horizontal symmetry about the multiplying cells 628, 643, which can be the middle cells in the array. The in-phase and quadrature multiplying cells of the multiplying cell array 620 are interleaved to achieve spatial averaging of error and to suppress the image frequency (e.g., the aliased signal), as discussed above with reference to FIG. 4.

Eight multiplying cells 621, 625, 631, 635, 637, 641, 645, 649 receive the most significant quadrature bit (Q[3]), four multiplying cells 623, 633, 639, 647 receive the next most significant quadrature bit (Q[2]), two multiplying cells 627, 629 receive the next most significant quadrature bit (Q[1]), and one multiplying cell 643 receives the least significant quadrature bit (Q[0]). Eight multiplying cells 622, 626, 630, 634, 636, 640, 646, 650 receive the most significant in-phase bit (I[3]), four multiplying cells 624, 632, 638, 648 receive the next most significant in-phase bit (I[2]), two multiplying cells 642, 644 receive the next most significant in-phase bit (I[1]), and one multiplying cell 628 receives the least significant in-phase bit (I[0]).

The multiplying cell array 620 experiences gradient error 651 causing attenuation of the local oscillator signal from left to right across the multiplying cell array 620 such that the amplitude of the local oscillator current decreases by a factor δ from one multiplying cell to an adjacent multiplying cell. Due to the symmetry of the multiplying cell array 620, the linearity of the D/A conversion is preserved and the image frequency is suppressed, as discussed in further detail below with reference to FIG. 7B.

The multiplying cell array 660 comprises a two-by-fifteen array of interleaved in-phase and quadrature multiplying cells 661-690. The multiplying cell array 660 receives four quadrature bits Q[3], Q[2], Q[1], and Q[0], which are listed in decreasing order of significance, and four in-phase bits I[3], I[2], I[1], and I[0], which also are listed in decreasing order of significance. Each quadrature bit and each in-phase bit is received by a binary-weighted number of multiplying cells. The multiplying cell array 660 exhibits horizontal symmetry about the multiplying cells 668, 663, which can be the middle cells in the array. Like the multiplying cell array 620, the in-phase and quadrature multiplying cells of the multiplying cell array 660 are interleaved to achieve spatial averaging of error and to suppress the image frequency (e.g., the aliased signal), as discussed above with reference to FIG. 4. However, the multiplying cell array 660 exhibits a different interleaving of the multiplying cells than the multiplying cell array 620.

Eight multiplying cells 661, 663, 673, 675, 677, 679, 687, 689 receive the most significant quadrature bit (Q[3]), four multiplying cells 665, 671, 684, 685 receive the next most significant quadrature bit (Q[2]), two multiplying cells 667, 669 receive the next most significant quadrature bit (Q[1]), and one multiplying cell 683 receives the least significant quadrature bit (Q[0]). Eight multiplying cells 662, 664, 672, 674, 676, 678, 688, 690 receive the most significant in-phase bit (I[3]), four multiplying cells 666, 670, 680, 686 receive the next most significant in-phase bit (I[2]), two multiplying cells 682, 684 receive the next most significant in-phase bit (I[1]), and one multiplying cell 668 receives the least significant in-phase bit (I[0]).

The multiplying cell array 660 experiences gradient error 691 causing attenuation of the local oscillator signal from left to right across the multiplying cell array 660 such that the amplitude of the local oscillator current decreases by a factor δ from one multiplying cell to an adjacent multiplying cell. Due to the symmetry of the multiplying cell array 660, the linearity of the D/A conversion is preserved and the image frequency is suppressed, as discussed in further detail below with reference to FIG. 7C. By extending the above-described techniques using more multiplying cells, an I/Q RF D/A converter of arbitrary resolution (e.g., N bits, N being an integer) may be realized. In certain embodiments, the required resolution may result in the die area and/or the power requirements of the multiplying core becoming impractical to implement a 2×M array where M is $2^N-1$. The required resolution may be defined as the number of bits converted at a time in the D/A converter. In such instances, multiplying cells may be stacked for better form factor, as discussed in further detail below with reference to FIGS. 8A-8B. Alternatively, power and/or die area requirements may be reduced when extending the resolution by including multiplying cells that interpolate between successive states of the multiplying cell array, such as the "interpolation cells" as discussed in U.S. Pat. No. 6,952,177.

FIGS. 7A-7C depict output signal tables summarizing the currents produced by the arrays of FIGS. 6A-6C. FIG. 7A depicts an output signal table 700 summarizing the currents produced by the multiplying cell array 600, FIG. 7B depicts an output signal table 720 summarizing the currents produced by the multiplying cell array 620, and FIG. 7C depicts an output signal table 760 summarizing the currents produced by the multiplying cell array 660. The current contribution, when summed, cancels out gradient errors due to the bit-wise interleaving of the multiplying cells. Interleaving offers a spatial averaging which maintains linearity of the D/A conversion and equalizes gain for both the in-phase and quadrature paths.

Output signal table 700 depicts the currents produces by each of bits Q[2], Q[1], Q[0], I[2], I[1], and I[0] in the multiplying cell array 600. As depicted in FIG. 6A, the in-phase and quadrature multiplying cells 601-614 are interleaved in the multiplying cell array 600. The outputs from multiplying cells 601-607 combine in phase at a first output transmission line, which can be the first output line 422, while outputs from multiplying cells 608-614 combine in phase at a second output transmission line, which can be the second output line 424. As depicted in output signal table 700, the Q[2] and I[2] bits contribute to both output transmission lines, the Q[1] and I[0] bits contribute to the first output transmission line, and the Q[0] and I[1] bits contribute to the second output transmission line.

Referring to FIG. 6A, if current at the rightmost multiplying cells 601, 608 is $\pm(1+3\delta) i_{LO}$, current at the cells 602, 609 is $\pm(1+2\delta) i_{LO}$, and so on, the middle cells 604, 611 will have a current of $\pm i_{LO}$, and the leftmost multiplying cells 607, 614 will see $\pm(1-3\delta) i_{LO}$. Referring to FIG. 7A, the output from the Q[0] bit will be $\pm i_{LO}$, the Q[1] bit will provide $\pm[1+\delta)+(1-\delta)] i_{LO}=\pm 2 i_{LO}$, and the output from the Q[2] bit will similarly sum to $\pm 4 i_{LO}$. Likewise, the outputs of the in-phase bits I[2], I[1], and I[0] will sum to $\pm 4 i_{LO}$, $\pm 2 i_{LO}$, and $\pm i_{LO}$, respectively, due to the symmetry of the multiplying cell array 600. Thus, the linearity in the D/A conversion is maintained in the presence of any gradient error 615 across the multiplying cell array 600, including those gradients which may result from device or timing mismatches.

Table 720 depicts the currents produces by each of bits Q[3], Q[2], Q[1], Q[0], I[3], I[2], I[1], and I[0] in the multiplying cell array 620. As depicted in FIG. 6B, the in-phase and quadrature multiplying cells 621-650 are interleaved in the multiplying cell array 620. The outputs from multiplying cells 621-635 combine in phase at a first output transmission line (e.g., the first output line 422) while outputs from multiplying cells 636-650 combine in phase at a second output transmission line (e.g., the second output line 424). As depicted in output signal table 720, the Q[3], Q[2], I[3], and I[2] bits contribute to both output transmission lines, the Q[1] and I[0] bits contribute to the first output transmission line, and the Q[0] and I[1] bits contribute to the second output transmission line.

Referring to FIG. 6B, if current at the rightmost multiplying cells 621, 636 is $\pm(1+7\delta) i_{LO}$, current at the cells 622, 637 is $\pm(1+6\delta) i_{LO}$, and so on, the middle cells 628, 643 will have a current of $\pm i_{LO}$, and the leftmost multiplying cells 635, 650 will see $\pm(1-7\delta) i_{LO}$. Referring to FIG. 7B, the output from the Q[0] bit will be $\pm i_{LO}$, the Q[1] bit will provide $\pm[(1+\delta)+(1-\delta)] i_{LO}=\pm 2 i_{LO}$, the Q[2] bit will provide $\pm[(\pm(1+5\delta)+(1+4\delta)+(1-4\delta)+(1-5\delta)]_{LO}=\pm 4 i_{LO}$, and the output from the Q[3] bit will similarly sum to $\pm 8 i_{LO}$. Likewise, the outputs of the in-phase bits I[3], I[2], I[1], and I[0] will sum to $\pm 8 i_{LO}$, $\pm 4 i_{LO}$, $\pm 2 i_{LO}$, and $\pm i_{LO}$, respectively, due to the symmetry of the multiplying cell array 620. Thus, the linearity in the D/A conversion is maintained in the presence of any gradient error 615 across the multiplying cell array 620, including those gradients which may result from device or timing mismatches.

Table 760 depicts the currents produces by each of bits Q[3], Q[2], Q[1], Q[0], I[3], I[2], I[1], and I[0] in the multiplying cell array 660. As depicted in FIG. 6C, the in-phase and quadrature multiplying cells 621-650 are interleaved in the multiplying cell array 660. The outputs from multiplying cells 621-635 combine in phase at a first output transmission line, which can be the first output line 422, while outputs from multiplying cells 636-650 combine in phase at a second output transmission line, which can be the second output line 424. As depicted in output signal table 760, the Q[3], Q[2], I[3], and I[2] bits contribute to both output transmission lines, the Q[1] and I[0] bits contribute to the first output transmission line, and the Q[0] and I[1] bits contribute to the second output transmission line.

Referring to FIG. 6C, if current at the rightmost multiplying cells 661, 676 is $\pm(1+7\delta) i_{LO}$, current at the cells 662, 677 is $\pm(1+6\delta) i_{LO}$, and so on, the middle cells 668, 683 will have a current of $\pm$iLO, and the leftmost multiplying cells 675, 690 will see $\pm(1-7\delta)$ iLO. Referring to FIG. 7C, the output from the Q[0] bit will be $\pm$iLO, the Q[1] bit will provide $\pm[(1+\delta)+(1-\delta)]$ iLO$=\pm 2$ iLO, the Q[2] bit will provide $\pm[(\pm(1+3\delta)+(1+2\delta)+(1-2\delta)+(1-3\delta)]_{LO}=\pm 4 i_{LO}$, and the output from the Q[3] bit will similarly sum to $\pm 8 i_{LO}$. Likewise, the outputs of the in-phase bits I[3], I[2], I[1], and I[0] will sum to $\pm 8 i_{LO}$, $\pm 4 i_{LO}$, $\pm 2 i_{LO}$, and $\pm i_{LO}$, respectively, due to the symmetry of the multiplying cell array 660.

Due to the different arrangement of interleaved multiplying cells in the multiplying cell array 660 as compared to the multiplying cell array 620, the Q[3], Q[2], I[3], and I[2] bits produce different amounts of error $\delta$ as compared to the table 720. However, the horizontal symmetry of the multiplying cell array 660 causes the error $\delta$ to cancel out as the output current from each multiplying cell 661-690 combine on the output transmission lines. Thus, the linearity in the D/A conversion is maintained in the presence of any gradient error 615 across the multiplying cell array 660, including those gradients which may result from device or timing mismatches.

Figure 8A:
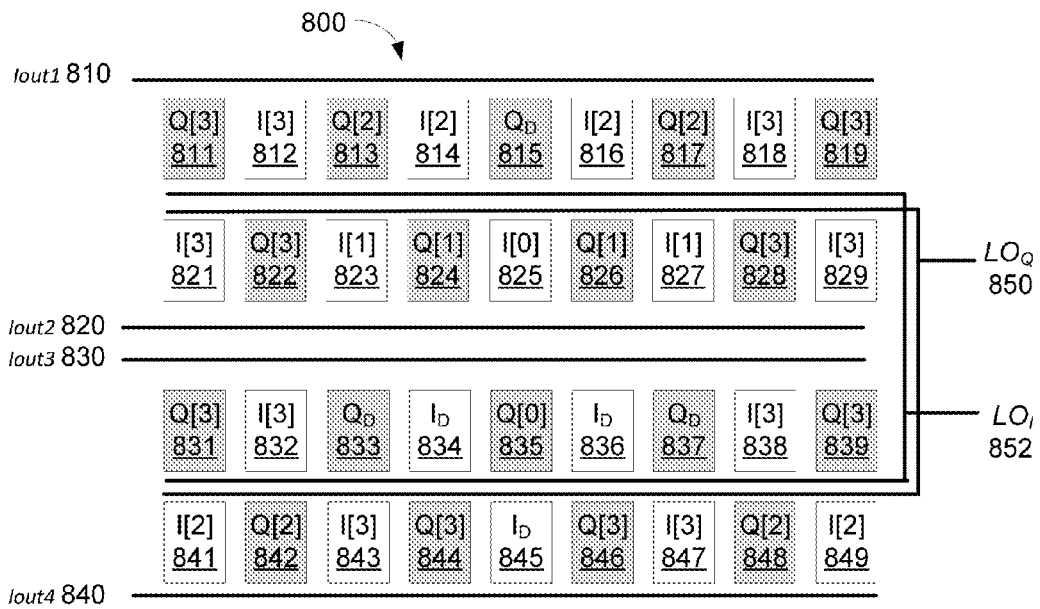
FIG. 8A is a block diagram illustrating one embodiment of an in-phase-and-quadrature D/A multiplying core.
Figure 8B:
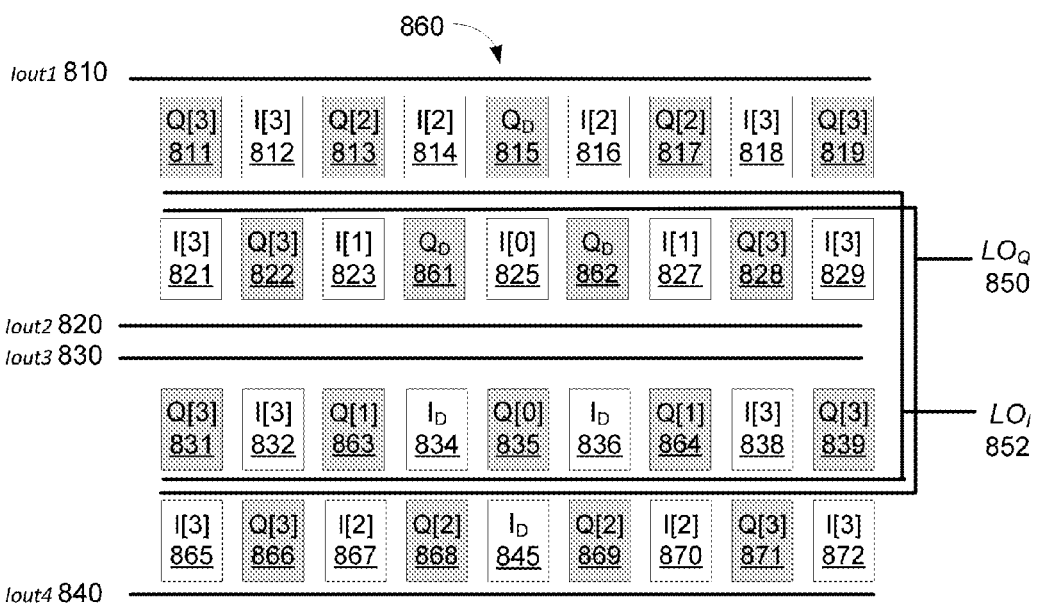
FIG. 8B is a block diagram illustrating another embodiment of an in-phase-and-quadrature D/A multiplying core.

FIGS. 8A-8B depict simplified I/Q D/A multiplying cores for four-bit D/A conversion, according to embodiments of the disclosure. The in-phase multiplying cells and the quadrature multiplying cells are arranged in a K×M array of multiplying cells composed of K rows and M columns. In some embodiments, K is an even integer greater than, or equal to, two and M is an odd integer selected such that the number of cells in the K×M array is greater than, or equal to, $2\times(2^N-1)$, where N is the number of in-phase (or quadrature) bits received by the I/Q D/A multiplying core. For example, FIGS. 8A-8B depict arrays where K is equal to four, and M is the smallest odd integer such that $4M>2(2^N-1)$, where N is the number of in-phase input bits (also four).

FIG. 8A depicts a four-bit I/Q D/A multiplying core 800, such as the I/Q RF D/A multiplying core 212, and/or the I/Q RF multiplying core 306, containing multiplying cells arranged in a four-by-nine (4×9) array and converting four bits. FIG. 8B depicts a four-bit I/Q D/A multiplying core 860, such as the I/Q RF D/A multiplying core 212, and/or the I/Q RF multiplying core 306, having an alternative arrangement of a four-by-nine (4×9) array of multiplying cells. While FIGS. 8A-8B depict four-bit implementations, the concepts disclosed may be implemented for greater amounts of input bits.

In certain embodiments, the desired resolution of an I/Q RF D/A converter may necessitate stacked rows of multiplying cells to prevent the I/Q RF core from taking up too much die area. The desired resolution of the I/Q RF D/A converter may be defined as the desired number of bits converted at a time in the D/A converter. In some embodiments, the multiplying cells are stacked height-wise so that the array of multiplying cells includes three or more rows of multiplying cells (e.g., a 4×9 array as depicted). In other embodiments, the multiplying cells are stacked depth-wise, forming a three dimensional array of multiplying cells (e.g., a 2×2×9 array).

Where more than two rows are employed in an array of multiplying cells, the array may include one or more dummy multiplying cells on a row to maintain the symmetry of the row. A dummy multiplying cell would occupy a space in the array and allow for spatial averaging but would not contribute an output signal to the output line(s). In some embodiments, each dummy multiplying cell is connected to input transmission lines, but produces no output signal. The input transmission lines can be local oscillator signal lines and/or input bit lines. Thus, the dummy multiplying cell would act like a multiplying cell that always receives a bit value of zero. In other embodiments, the dummy multiplying cell takes up die area, but is not connected to input or output transmission lines, thereby minimizing power consumption and/or interference.

FIG. 8A depicts the I/Q D/A multiplying core 800, which includes a 4×9 array of interleaved in-phase and quadrature multiplying cells. Each quadrature bit and each in-phase bit is received by a binary-weighted number of multiplying cells. The I/Q D/A multiplying core 800 contains a first output line 810 connected to a first row of multiplying cells, which can be multiplying cells 811-819, a second output line 820 connected to a second row of multiplying cells, which can be multiplying cells 821-829, a third output line 830 connected to a third row of multiplying cells, which can be multiplying cells 831-839, and a fourth output line 840 connected to a fourth row of multiplying cells, which can be multiplying cells 841-849. The I/Q D/A multiplying core 800 exhibits horizontal symmetry about the middle cells in the array. The middle cells can be multiplying cells 815, 825, 835, and 845.

Each multiplying cell in the array receives a local oscillator signal via either the $LO_Q$ line 850 or the $LO_I$ line 852. Further, each row of multiplying cells in the I/Q D/A multiplying core 800 interleaves in-phase and quadrature multiplying cells to achieve spatial averaging of gradient error and to better suppress the image frequency (e.g., the aliased signal), as discussed above with reference to FIGS. 4, 6A-6C, and 7A-7C.

The I/Q D/A multiplying core 800 contains thirty-six (36) multiplying cells, but only thirty (30) multiplying cells are needed to implement a four-bit D/A converter (e.g., $2\times(2^4-1)=2\times15=30$). Thus, the I/Q D/A multiplying core 800 includes six dummy multiplying cells 815, 833, 834, 835, 836, 837, and 845. These dummy multiplying cells are configured to act like a multiplying cell that always receives a bit value of zero. For example, in an I/Q D/A multiplying core 800 using differential current signaling, the dummy multiplying cells produce a constant output equal to the DC bias.

In the presence of a gradient error, the I/Q D/A multiplying core 800 preserves linearity of the D/A conversion due to the horizontal symmetry of each row in the multiplying cell array. Accordingly, the I/Q D/A multiplying core 800 exhibits the same performance and image frequency suppression as the multiplying cell arrays 620 and 660, discussed above with relation to FIGS. 6B-6C, while reducing core width at the expense of core height. Thus, the I/Q D/A multiplying core 800 may be a preferred implementation in environments with space constraints.

FIG. 8B depicts the I/Q D/A multiplying core 860, which also includes a four-by-nine (4×9) array of multiplying cells. Each quadrature bit and each in-phase bit is received by a binary-weighted number of multiplying cells. The I/Q D/A multiplying core 860 has an alternative arrangement of multiplying cells as compared to the I/Q D/A multiplying core 800. Similar to the I/Q D/A multiplying core 800, the I/Q D/A multiplying core 860 includes a first output line 810 connected to a first row of multiplying cells, a second output line 820 connected to a second row of multiplying cells, a third output line 830 connected to a third row of multiplying cells, and a fourth output line 840 connected to a fourth row of multiplying cells, a $LO_Q$ line 850, and a $LO_I$ line 852. The I/Q D/A multiplying core 860 exhibits horizontal symmetry on each row of multiplying cells and also exhibits a vertical symmetry about the output lines 820 and 830.

The I/Q D/A multiplying core 860 spatially averages the distribution of dummy multiplying cells among the four rows of multiplying cells. As depicted, the first and fourth rows each contain one dummy multiplying cell (dummy multiplying cells 815 and 845, respectively) while the second and third rows each contain two dummy multiplying cells (dummy multiplying cells 861-862 and 863-864, respectively). Also as depicted, the fourth row includes interleaved in-phase and quadrature multiplying cells 865-872. With the exception that in-phase cells and quadrature cells are swapped, the I/Q D/A multiplying core 860 exhibits increased symmetry as the first row matches the fourth row and the second row matches the third row. In some embodiments, the I/Q D/A multiplying core 860 will exhibit less error than the I/Q D/A multiplying core 800 in the presence of a vertical gradient error.

Figure 9:
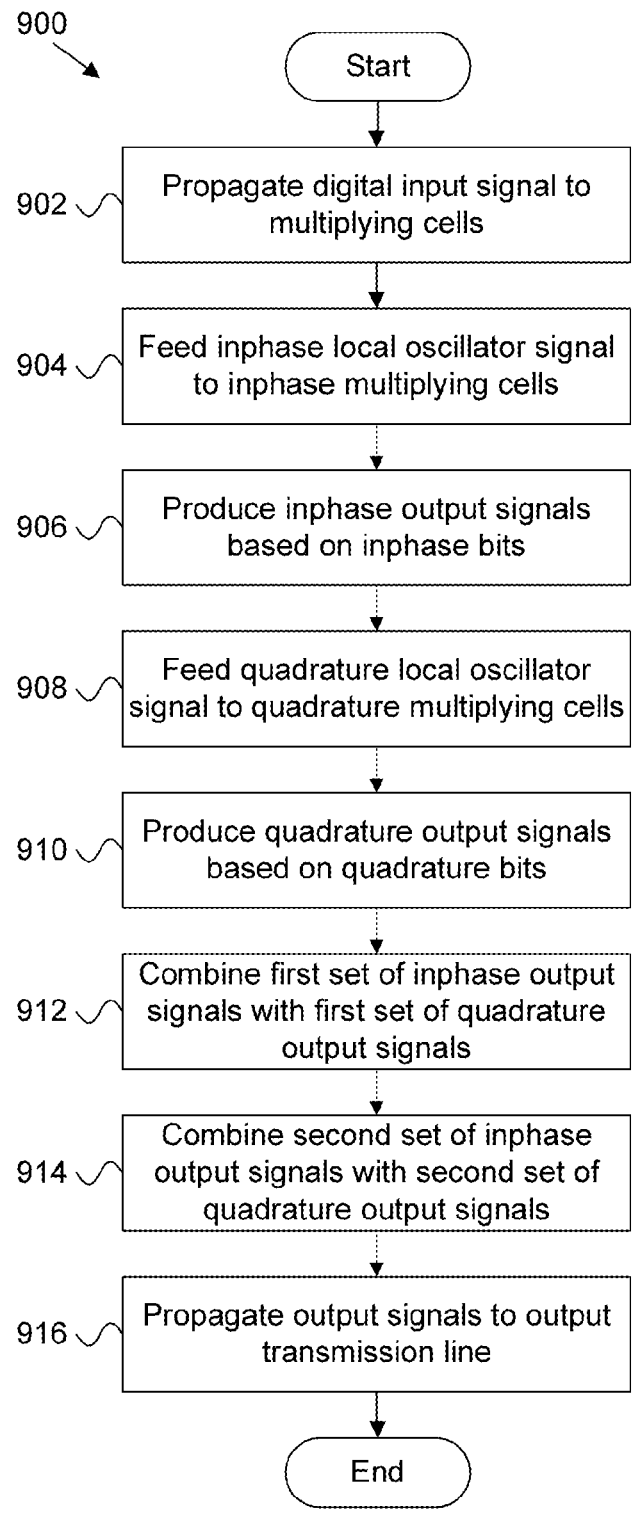
FIG. 9 is a schematic flow chart illustrating one embodiment of a method for radio frequency D/A conversion of in-phase and quadrature bit streams.

FIG. 9 depicts a method 900 for radio frequency D/A conversion of in-phase and quadrature bit streams, according to embodiments of the disclosure. The method 900 begins and a digital input signal propagates 902 along a plurality of input bit transmission lines. The digital input signal includes a plurality of in-phase bits and a plurality of quadrature bits. Each in-phase bit propagates 902 on one or more input bit transmission lines and each quadrature bit propagates 902 on one or more input bit transmission lines. The digital input signal propagates 902 to a plurality of in-phase multiplying cells and a plurality of quadrature multiplying cells.

An in-phase local oscillator signal transmission line then feeds 904 an in-phase local oscillator signal to each in-phase multiplying cell. The in-phase local oscillator signal is a radio frequency (RF) signal, as opposed to an intermediate frequency signal. In some embodiments, the local oscillator signal is a differential signal carried on a pair of transmission lines. The in-phase multiplying cells then produce 906 a plurality of in-phase analog output signals. Each in-phase multiplying cell produces 906 an analog output signal based on a received in-phase bit and the in-phase local oscillator signal. In some embodiments, the in-phase multiplying cells directly modulate the in-phase bits onto a RF carrier. In certain embodiments, the analog output signals are differential signals.

A quadrature local oscillator signal transmission line then feeds 908 a quadrature local oscillator signal to each quadrature multiplying cell. The quadrature local oscillator signal is a radio frequency signal, as opposed to an intermediate frequency signal. In some embodiments, the local oscillator signal is a differential signal carried on a pair of transmission lines. The quadrature multiplying cells then produce 910 a plurality of quadrature analog output signals. Each quadrature multiplying cell produces 910 an analog output signal based on a received quadrature bit and the quadrature local oscillator signal. In some embodiments, the quadrature multiplying cells directly modulate the quadrature bits onto a RF carrier. In certain embodiments, the analog output signals are differential signals.

A first output transmission line combines 912 the analog output signals from a first set of in-phase multiplying cells and a first set of quadrature multiplying cells to form a first analog signal. The first set of in-phase multiplying cells and the first set of quadrature multiplying cells are component matched and propagation-delay matched so that the analog output signals combine 912 in phase according to traveling wave principles. In some embodiments, the analog output signals are differential signals propagated to a first pair of output transmission lines.

A second output transmission line combines 914 the analog output signals from a second set of in-phase multiplying cells and a second set of quadrature multiplying cells to form a second analog signal. The second set of in-phase multiplying cells and the second set of quadrature multiplying cells are component matched and propagation-delay matched so that the analog output signals combine 914 in phase according to traveling wave principles. In some embodiments, the analog output signals are differential signals propagated to a second pair of output transmission lines.

The first output transmission line and the second output transmission line then propagate 916 the first analog signal and the second analog signal, respectively, to a radio frequency (RF) output transmission line, and the method 900 ends. In some embodiments, the first analog signal and the second analog signal are combined prior to the RF output transmission line. The first output transmission line and the second output transmission line may be propagation-delay matched so as to combine, in phase, their outputs without the need of additional RF summation circuits.

As used herein, the phrase "at least one of", when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required. For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other suitable combination.

The present subject matter may be embodied in other specific forms without departing from its spirit or essential characteristics. The described embodiments are to be considered in all respects only as illustrative and not restrictive. All changes which come within the meaning and range of equivalency of the claims are to be embraced within their scope.

What is claimed is:

1. An apparatus, comprising:
   a plurality of in-phase multiplying cells that receive an in-phase local oscillator signal and a plurality of in-phase bits, each in-phase multiplying cell producing an output signal based on a received one of the plurality of in-phase bits, wherein each in-phase bit has a significance from most significant to least significant and a binary-weighted number of in-phase multiplying cells are connected to each in-phase bit, the binary-weighted number matching the significance of the in-phase bit;
   a plurality of quadrature multiplying cells that receive a quadrature local oscillator signal and a plurality of quadrature bits, each quadrature multiplying cell producing an output signal based on the received one of the plurality of quadrature bits, wherein each quadrature bit has a significance from most significant to least significant and a binary-weighted number of quadrature multiplying cells are connected to each quadrature bit, the binary-weighted number matching the significance of the quadrature bit;
   a first output line connected to a first set of the plurality of in-phase multiplying cells and a first set of the plurality of quadrature multiplying cells, the first output line propagating a first output signal produced from output signals of the first set of the plurality of in-phase multiplying cells and the first set of the plurality of quadrature multiplying cells; and
   a second output line connected to a second set of the plurality of in-phase multiplying cells and a second set of the plurality of quadrature multiplying cells, the second output line propagating a second output signal produced from output signals of the second set of the plurality of in-phase multiplying cells and the second set of the plurality of quadrature multiplying cells.

2. The apparatus of claim 1, further comprising:
   a third output line connected to a third set of the plurality of in-phase multiplying cells and a third set of the plurality of quadrature multiplying cells, the third output line propagating a third output signal produced from output signals of the third set of the plurality of in-phase multiplying cells and the third set of the plurality of quadrature multiplying cells; and
   a fourth output line connected to a fourth set of the plurality of in-phase multiplying cells and a fourth set of the plurality of quadrature multiplying cells, the fourth output line propagating a fourth output signal produced from output signals of the fourth set of the plurality of in-phase multiplying cells and the fourth set of the plurality of quadrature multiplying cells.

3. The apparatus of claim 2, further comprising:
   at least one dummy in-phase multiplying cell that produces no output signal; and
   at least one dummy quadrature multiplying cell that produces no output signal,
   wherein the plurality of in-phase multiplying cells, the plurality of quadrature multiplying cells, the at least one dummy in-phase multiplying cell, and the at least one dummy quadrature multiplying cell are arranged into four rows.

4. The apparatus of claim 3, wherein the four rows comprise:
   a first row comprising the first set of the plurality of in-phase multiplying cells, the first set of the plurality of quadrature multiplying cells, and a dummy quadrature multiplying cell;
   a second row comprising the second set of the plurality of in-phase multiplying cells and the second set of the plurality of quadrature multiplying cells;
   a third row comprising the third set of the plurality of in-phase multiplying cells and the third set of the plurality of quadrature multiplying cells; and
   a fourth row comprising the fourth set of the plurality of in-phase multiplying cells, the fourth set of the plurality of quadrature multiplying cells, and a dummy in-phase multiplying cell.

5. The apparatus of claim 4, wherein the second row comprises a pair of dummy quadrature multiplying cells arranged symmetrically about a center of the second row, and
   wherein the third row comprises a pair of dummy in-phase multiplying cells arranged symmetrically about a center of the third row.

6. The apparatus of claim 4, wherein the third row comprises a pair of dummy quadrature multiplying cells arranged symmetrically about the center of the second row and a pair of dummy in-phase multiplying cells arranged symmetrically about the center of the second row.

7. The apparatus of claim 4, wherein the second row comprises an in-phase multiplying cell connected to a least significant in-phase bit and arranged at a center of the second row and a pair of in-phase multiplying cells connected to a most significant in-phase bit and arranged at each end of the second row, and
   wherein the third row comprises a quadrature multiplying cell connected to a least significant quadrature bit and arranged at a center of the third row and a pair of quadrature multiplying cells connected to a most significant quadrature bit and arranged at each end of the third row.

8. The apparatus of claim 3, wherein the each of the at least one dummy in-phase multiplying cell receives an in-phase local oscillator signal, and wherein each of the at least one dummy quadrature multiplying cell receives a quadrature local oscillator signal.

9. The apparatus of claim 2, wherein the first set of the plurality of in-phase multiplying cells are interleaved among the first set of the plurality of quadrature multiplying cells, the second set of the plurality of in-phase multiplying cells are interleaved among the second set of the plurality of quadrature multiplying cells, the third set of the plurality of in-phase multiplying cells are interleaved among the third set of the plurality of quadrature multiplying cells, and the fourth set of the plurality of in-phase multiplying cells are interleaved among the fourth set of the plurality of quadrature multiplying cells.

10. The apparatus of claim 1, wherein the plurality of in-phase multiplying cells and the plurality of quadrature multiplying cells are component-matched multiplying cells and have substantially identical impedances and propagation delays.

11. A method comprising:
propagating a digital input signal comprising a plurality of in-phase bits and a plurality of quadrature bits;
feeding each of a plurality of in-phase multiplying cells an in-phase local oscillator signal and one of the plurality of in-phase bits, wherein each in-phase bit has a significance from most significant to least significant and a binary-weighted number of in-phase multiplying cells are connected to each in-phase bit, the binary-weighted number matching the significance of the in-phase bit;
producing a plurality of in-phase analog output signals, each in-phase multiplying cell producing an in-phase analog output signal based on the one of the plurality of in-phase bits;
feeding each of a plurality of quadrature multiplying cells a quadrature local oscillator signal and one of the plurality of quadrature bits, wherein each quadrature bit has a significance from most significant to least significant and a binary-weighted number of quadrature multiplying cells are connected to each quadrature bit, the binary-weighted number matching the significance of the quadrature bit;
producing a plurality of quadrature analog output signals, each quadrature multiplying cell producing a quadrature analog output signal based on the one of the plurality of quadrature bits;
combining, in phase, a first set of the plurality of in-phase analog output signals and a first set of the plurality of quadrature analog output signals to form a first analog signal;
combining, in phase, a second set of the plurality of in-phase analog output signals and a second set of the plurality of quadrature analog output signals to form a second analog signal; and
propagating the first analog signal and the second analog signal on an output transmission line.

12. The method of claim 11, further comprising:
combining, in phase, a third set of the plurality of in-phase analog output signals and a third set of the plurality of quadrature analog output signals to form a third analog signal; and
combining, in phase, a fourth set of the plurality of in-phase analog output signals and a fourth set of the plurality of quadrature analog output signals to form a fourth analog signal,
wherein propagating the first analog signal and the second analog signal on an output transmission line comprises combining, in phase, the first analog signal, the second analog signal, the third analog signal, and the fourth analog signal to form a combined output signal.

13. The method of claim 12, further comprising:
feeding at least one dummy in-phase multiplying cell with the in-phase local oscillator signal, wherein each of the at least one dummy in-phase multiplying cell produces no output signal; and
feeding at least one dummy quadrature multiplying cell with the quadrature local oscillator signal, wherein each of the at least one dummy quadrature multiplying cell produces no output signal,
wherein the plurality of in-phase multiplying cells, the plurality of quadrature multiplying cells, the at least one dummy in-phase multiplying cell, and the at least one dummy quadrature multiplying cell are arranged into four rows.

14. A system, comprising:
a local oscillator module that provides an in-phase local oscillator signal and a quadrature local oscillator signal;
a digital data module that provides a plurality of in-phase bits and a plurality of quadrature bits;
an in-phase-and-quadrature (I/Q) digital-to-analog converter comprising:
a plurality of in-phase multiplying cells that receive the in-phase local oscillator signal and the plurality of in-phase bits, each in-phase multiplying cell modulating a received one of the plurality of in-phase bits onto the in-phase local oscillator signal;
a plurality of quadrature multiplying cells that receive the quadrature local oscillator signal and the plurality of quadrature bits, each quadrature multiplying cell modulating a received one of the plurality of quadrature bits onto the quadrature local oscillator signal;
a first output line connected to a first set of the plurality of in-phase multiplying cells and a first set of the plurality of quadrature multiplying cells, the first output line combining output signals of the first set of the plurality of in-phase multiplying cells and the first set of the plurality of quadrature multiplying cells into a first output signal, wherein the first set of the plurality of in-phase multiplying cells and the first set of the plurality of quadrature multiplying cells are arranged into a first row; and
a second output line connected to a second set of the plurality of in-phase multiplying cells and a second set of the plurality of quadrature multiplying cells, the second output line combining output signals of the second set of the plurality of in-phase multiplying cells and the second set of the plurality of quadrature multiplying cells into a second output signal, wherein the second set of the plurality of in-phase multiplying cells and the second set of the plurality of quadrature multiplying cells are arranged into a second row; and
a radio frequency (RF) output transmission line connected to the first output line and the second output line, the RF output transmission line propagating an RF analog output signal based on the first output signal and the second output signal.

15. The system of claim 14, wherein the plurality of in-phase multiplying cells and the plurality of quadrature multiplying cells are further arranged into a plurality of columns, each column consisting of one of the in-phase multiplying cells and one of the quadrature multiplying cells.

16. The system of claim 14, wherein each in-phase bit has a significance from most significant to least significant and a binary-weighted number of in-phase multiplying cells are connected to each in-phase bit, the binary-weighted number matching the significance of the in-phase bit, and wherein each quadrature bit has a significance from most significant to least significant and a binary-weighted number of quadrature multiplying cells are connected to each quadrature bit, the binary-weighted number matching the significance of the quadrature bit.

17. The system of claim 14, wherein the plurality of in-phase multiplying cells and the plurality of quadrature multiplying cells are integrated onto a common semiconductor core.

18. The system of claim 17, wherein the in-phase multiplying cells and the quadrature multiplying cells are spatially interleaved on the common semiconductor core.

19. The system of claim 14, wherein the in-phase multiplying cells and the quadrature multiplying cells are arranged in a K×M array of multiplying cells, where K is an integer number of rows greater than one.

20. The system of claim 14, wherein the local oscillator module comprises:
- an in-phase local oscillator transmission line connected to the in-phase multiplying cells that carries the in-phase local oscillator signal; and
- a quadrature local oscillator transmission line connected to the quadrature multiplying cells that carries the quadrature local oscillator signal.

* * * * *